US012631676B2

(12) United States Patent
Schreier et al.

(10) Patent No.: US 12,631,676 B2
(45) Date of Patent: May 19, 2026

(54) METHOD FOR TUNING AN ELECTROCHEMICAL DOUBLE LAYER TO GENERATE SOUND REPRESENTATIVE OF PROPERTIES OF THE DOUBLE LAYER

(71) Applicant: Wisconsin Alumni Research Foundation, Madison, WI (US)

(72) Inventors: Marcel Schreier, Pfeffingen (CH); Christine Lucky, Madison, WI (US); Megan Kelly, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 191 days.

(21) Appl. No.: 18/615,862

(22) Filed: Mar. 25, 2024

(65) Prior Publication Data

US 2024/0319249 A1     Sep. 26, 2024

Related U.S. Application Data

(60) Provisional application No. 63/492,073, filed on Mar. 24, 2023.

(51) Int. Cl.
G01N 27/42     (2006.01)
G01N 29/036     (2006.01)
(Continued)

(52) U.S. Cl.
CPC ......... G01R 31/016 (2013.01); G01N 29/036 (2013.01); G01R 9/00 (2013.01); G01R 23/04 (2013.01)

(58) Field of Classification Search
CPC ...... G01R 9/00; G01R 29/036; G01R 31/016; G01N 29/036
See application file for complete search history.

(56) References Cited

U.S. PATENT DOCUMENTS 4,553,099 A * 11/1985 Kasahara ............... G01R 29/24
                                                    324/458
5,202,637 A * 4/1993 Jones ................... G01N 33/007
                                                    324/425
(Continued)

FOREIGN PATENT DOCUMENTS

WO          WO-0027166      *  5/2000

OTHER PUBLICATIONS

Bard, A. J.; Faulkner, L. R. Electrochemical Methods Fundamentals and Applications, 2nd ed.; John Wiley & Sons: Hoboken, 2001. Book.

(Continued)

*Primary Examiner* — Thang X Le
(74) *Attorney, Agent, or Firm* — Joseph T. Leone; Yanjun Ma; DeWitt LLP

(57)          ABSTRACT

A method (and corresponding apparatus) of analyzing the behavior of an electrochemical double layer (EDL) by replacing a classic capacitor in an astable multivibrator circuit with an electrochemical cell. By pushing the EDL into resonance, the induced charging and discharging of the double layer results in a square waveform output that has a characteristic frequency audible to the human ear. Variations in the electrolyte concentration and identity yield distinct frequencies. The method provides sensory insight into EDL rearrangement and behavior with an apparatus that is simple and robust. The apparatus allows the analysis of time-dependent EDL rearrangements occurring upon the application of a voltage. The apparatus provides insight, via an audible signal perceptible to the human ear, into the fundamental electrochemical principles governing chemical transformations.

17 Claims, 19 Drawing Sheets

(51) Int. Cl.

| | | |
|---|---|---|
| *G01R 9/00* | (2006.01) | |
| *G01R 23/04* | (2006.01) | |
| *G01R 31/01* | (2020.01) | |

(56) References Cited

U.S. PATENT DOCUMENTS

| | | | | |
|---|---|---|---|---|
| 6,111,288 | A * | 8/2000 | Watanabe | H10D 48/362 |
| | | | | 257/E29.241 |
| 6,978,029 | B1 * | 12/2005 | Ikeda | H04R 3/007 |
| | | | | 381/191 |
| 8,623,197 | B1 * | 1/2014 | Kobsiriphat | G01N 17/02 |
| | | | | 73/83 |
| 2011/0301861 | A1 * | 12/2011 | Elder | G01N 27/3274 |
| | | | | 702/22 |
| 2020/0225188 | A1 * | 7/2020 | Huo | G01N 27/4165 |

OTHER PUBLICATIONS

Carr, J. P; Hampson, N. A. Differential Capacitance of the Platinum/Aqueous-Solution Interphase. Electrochim Acta 1972, 17 (12), 2117-2128. https://doi.org/10.1016/0013-4686(72)87003-8.

Conway, B. E.; Novak, D. M. Chloride Ion Adsorption Effects in the Recombination-Controlled Kinetics of Anodic Chlorine Evolution at Pt Electrodes. Journal of the Chemical Society, Faraday Transactions 1: Physical Chemistry in Condensed Phases 1979, 75 (0), 2454. https://doi.org/10.1039/f19797502454.

D. Armstrong, N.A. Hampson, R.J. Latham. The differential capacitance of polycrystalline copper in aqueous solution, Journal of Electroanalytical Chemistry and Interfacial Electrochemistry 1969, 23 (3), 361-367.

Damaskin, B. B.; Petrii, O. A. Historical Development of Theories of the Electrochemical Double Layer. Journal of Solid State Electrochemistry x, 15 (7-8), 1317-1334. https://doi.org/10.1007/s10008-011-1294-y.

Hecht, D.; Strehblow, H.-H. XPS Investigations of the Electrochemical Double Layer on Silver in Alkaline Chloride Solutions. Journal of Electroanalytical Chemistry 1997, 440 (1-2), 211-217. https://doi.org/10.1016/S0022-0728(97)80058-7.

IBM. A Boy and His Atom: The World's Smallest Movie. Apr. 30, 2013.

IBM. Moving Atoms: Making The World's Smallest Movie. Apr. 30, 2013.

James Marcicki, A.T. Conlisk, Giorgio Rizzoni, A lithium-ion battery model including electrical double layer effects, Journal of Power Sources 2014, 251, 157-169.

K.B. Oldham (2008) "A Gouy-Chapman-Stern model of the double layer at a (metal)/(ionic liquid) interface," J. Electroanalytical Chem. 613(2):131-138.

L. Stolberg, J. Richer, J. Lipkowski, D.E. Irish, Adsorption of pyridine at the polycrystalline gold-solution interface,Journal of Electroanalytical Chemistry and Interfacial Electrochemistry 1986, 207 (1-2) 213-214.

Li, H.; Zhang, W.; Yang, X.; Jiang, H.; Wang, Y.; Yang, T.; Chen, L.; Shen, H. State of Charge Estimation for Lithium-Ion Battery Using an Electrochemical Model Based on Electrical Double Layer Effect. Electrochim Acta 2019, 326, 134966. https://doi.org/10.1016/j.electacta.2019.134966.

Lust, E. Zero Charge Potentials and Electrical Double Layer at Solid Electrodes. In Encyclopedia of Interfacial Chemistry; Elsevier, 2018; pp. 316-344. https://doi.org/10.1016/B978-0-12-409547-2.13613-3.

Melnick, R. E.; Palmore, G. T. R. Impedance Spectroscopy of the Electro-Oxidation of Methanol on Polished Polycrystalline Platinum. J Phys Chem B 2001, 105 (5), 1012-1025. https://doi.org/10.1021/jp0030847.

N. A. Hampson et. al., J. Electrochem. Soc. 1967, 114 817.

Pajkossy, T. Impedance of Rough Capacitive Electrodes. Journal of Electroanalytical Chemistry 1994, 364 (1-2), 111-125. https://doi.org/10.1016/0022-0728(93)02949-I.

Pajkossy, T.; Kolb, D. M. Anion-Adsorption-Related Frequency-Dependent Double Layer Capacitance of the Platinum-Group Metals in the Double Layer Region. Electrochim Acta 2008, 53 (25), 7403-7409. https://doi.org/10.1016/j.electacta.2007.11.068.

Petrii, O. A. Zero Charge Potentials of Platinum Metals and Electron Work Functions (Review). Russian Journal of Electrochemistry 2013, 49 (5), 401-422. https://doi.org/10.1134/S1023193513050145.

Randles, J. E. B. (1947) "Kinetics of rapid electrode reactions," Discussions of the Faraday Society 1: 11.

Ringe, S.; Morales-Guio, C. G.; Chen, L. D.; Fields, M.; Jaramillo, T. F.; Hahn, C.; Chan, K. Double Layer Charging Driven Carbon Dioxide Adsorption Limits the Rate of Electrochemical Carbon Dioxide Reduction on Gold. Nat Commun 2020, 11 (1), 33. https://doi.org/10.1038/s41467-019-13777-z.

Simon, P.; Gogotsi, Y.; Dunn, B. Where Do Batteries End and Supercapacitors Begin? Science (1979) 2014, 343 (6176), 1210-1211. https://doi.org/10.1126/science.1249625.

T. Hurlen, W. Wilhelmsen. Passive behaviour of titanium, Electrochimica Acta 1986, 31 (9) 1139-1146.

Wang, Z., Cao, D., Wen, L. et al. Manipulation of charge transfer and transport in plasmonic-ferroelectric hybrids for photoelectrochemical applications. Nat Commun 7, 10348 (2016). https://doi.org/10.1038/ncomms10348.

Zhang, Z., Bian, L., Tian, H., Liu, Y., Bando, Y., Yamauchi, Y., Wang, Z.-L., Tailoring the Surface and Interface Structures of Copper-Based Catalysts for Electrochemical Reduction of CO2 to Ethylene and Ethanol. Small 2022, 18, 2107450. https://doi.org/10.1002/smll.202107450.

Zheng, Y.; Jiao, Y.; Jaroniec, M.; Qiao, S. Z. Advancing the Electrochemistry of the Hydrogen-Evolution Reaction through Combining Experiment and Theory. Angewandte Chemie International Edition 2015, 54 (1), 52-65. https://doi.org/10.1002/anie.201407031.

* cited by examiner

METHOD FOR TUNING AN ELECTROCHEMICAL DOUBLE LAYER TO GENERATE SOUND REPRESENTATIVE OF PROPERTIES OF THE DOUBLE LAYER

CROSS REFERENCE TO RELATED APPLICATION

This application claims the benefit of provisional application Ser. No. 63/492,073, filed Mar. 24, 2023, which is incorporated herein by reference.

BACKGROUND

The electrochemical double layer (EDL) is fundamental to the application of electrochemistry, where it forms the basis for the operation of important devices such as Li-Ion batteries (Li et al., 2019) and governs the kinetics of electrocatalytic energy storage reactions such as $CO_2$ reduction (Ringe et al., 2020) and H2 generation (Zheng et al., 2015). At its core, an EDL is formed upon the contact of an electrode and an electrolyte. The electrostatic potential difference between the two phases, be it intrinsic or externally applied, leads to the ordering of ions at the electrode-solution interface, due to electrostatic and chemical interactions between the electrode surface and the ions. This ordering creates a separation of charges at the electrode-electrolyte interface, with charged electrode on one side and charged ions on the other, which gives rise to a characteristic interfacial capacitance (Bard & Faulkner, 2001).

Interfacial ordering is believed to play an important role in mediating electrocatalytic reactions. For example, increasing the radius of the alkali cation in the electrolyte increases the formation of ethylene in $CO_2$ reduction electrocatalysis, while the concentration of cations is believed to control the availability of protons (Zhang et. al., 2022). In addition, the EDL manifests itself in the magnitude of band-bending in photoelectrochemical semiconductor-electrolyte interfaces (Wang et. al., 2016) and in the charge and discharge rate of Li-Ion batteries (Marcicki et. al., 2014). However, further engineering of the EDL for applications in batteries and electrocatalysis requires the ability to understand and tune EDL properties.

The invisible nature of the EDL makes its behavior challenging to probe and to understand. Existing methods to characterize the EDL such as electrochemical impedance spectroscopy (EIS) are slow and use non-intuitive phase angle measurements to characterize the molecular interactions. While EIS is powerful and widely used, it remains an intangible way of understanding the molecular interactions that occur at the EDL (Melnick & Palmore, 2001). Other methodologies such as X-ray photoelectron spectroscopy (XPS) provide molecular insight but require the use of expensive equipment and complex setups (Hecht & Strehblow, 1997).

SUMMARY OF THE INVENTION

As noted above, the electrochemical double layer (EDL) governs the function of batteries, fuel cells, electrolyzes, sensors, and many other electrochemical devices crucial to modern life and to enabling the transition to a renewable energy economy. However, the EDL is inherently challenging to understand because there are no existing methods to make its configuration and behavior perceivable or perceptible in ways that are intuitive to humans. Herein is demonstrated a new method of analyzing the behavior of the EDL by replacing a classic capacitor in an astable multivibrator circuit with an electrochemical cell. By pushing the EDL into resonance, the induced charging and discharging of the double layer results in a square waveform output that has a characteristic frequency audible to the human ear. Variations in the electrolyte concentration and identity yielded frequencies followed trends supported by classical EDL theory models such as the Gouy-Chapman Stern model. The technique provides sensory, audible insight into EDL rearrangement and behavior with a system that is simple yet robust. Beyond making EDL properties audible, the method enables analyzing time-dependent EDL rearrangements occurring upon the application of a voltage. As the interest in electrochemical technologies keeps growing, while fundamental understanding of the behavior of the underlying science remains scarce, the oscillator circuit disclosed herein provides improved and sensory insight into the fundamental electrochemical principles governing chemical transformations.

The present inventors determined that EDLs possess a characteristic resonance frequency, which is diagnostic and informative of its configuration. This resonance frequency can serve as a surrogate quantity to probe the properties of an EDL. When the resonant frequencies generated by an EDL are transformed into sounds (as disclosed herein), the sounds so generated convey the characteristics of the EDL to humans in a audible manner. Fundamentally, all sounds employed in electronic music are generated by voltage-controlled oscillators (VCO), which are characterized by an ability to change the pitch of an audible waveform through control-voltage inputs. A simple form of an VCO is the multivibrator, where the oscillation frequency is defined by the time it takes to charge and discharge a capacitor. Replacing the capacitor with an EDL (see FIGS. 2A and 2B) allows for controlling the pitch of an audible waveform through the voltage that is applied across the interface, but also by changing the fundamental properties of the EDL. The resonance frequency of the EDL is dependent on a multitude of factors including solvent identity, electrolyte concentration, electrolyte identity, electrode material, and applied potential. Because the resonance frequency is specific to the identity of the system, this can be used to characterize the movement of ions at the double layer. This provides unprecedented molecular insight into double layer behavior. Furthermore, because the frequency is audible, the EDL can be studied in a way that is perceptible to the human brain via sound.

Thus, disclosed herein is a novel method to characterize the EDL in real time using sound. By using an electrochemical cell as the capacitor in a multivibrator circuit, the EDL can be pushed into resonance by the application of a potential. This resonance has a characteristic frequency, which is in the range of human hearing. Sound has been used in previous applications to make atomic movement perceptible. This is shown schematically in FIG. 1, wherein the rearrangement of ions at the EDL in response to an applied voltage leads to audible frequencies once being coupled with the circuit shown in FIGS. 2A and 2B. Capture of CO molecules by an electron microscope has been monitored through sound,[8] allowing for precise control of atomic movement and creation of the world's smallest movie.[9] Hearing the interaction between the CO molecule and tip of the electron microscope was key in allowing the STM operators to move ions with the precision necessary for creating visual images. Thus, the astable multivibrator oscillator disclosed herein is an "auditory microscope" of sorts, allowing insight into ionic movements on the nanometer scale with a circuit connected to a speaker.

The method disclosed herein is a useful quantitative characterization technique for electrochemical cells. It is useful and informative in a range of settings, including: (i) highly sensitive commercial sensors for detecting adsorbates; (ii) a method for observing the rearranging of double layers in real time in research; (iii) a research and educational tool to make interfacial properties perceptible through sound, and (iv) as a method for sensing the EDL temperature. Overall, it will allow researchers to track and record EDL behavior in real time and will allow for better monitoring and understanding of electrochemical, electrocatalytic and battery systems.

Abbreviations and Definitions

All references to singular characteristics or limitations of the disclosed method shall include the corresponding plural characteristic or limitation, and vice-versa, unless otherwise specified or clearly implied to the contrary by the context in which the reference is made. The indefinite articles "a" and "an" mean "one or more."

All combinations of method steps disclosed herein can be performed in any order, unless otherwise specified or clearly implied to the contrary by the context in which the referenced combination is made.

The method disclosed herein can comprise, consist of, or consist essentially of the essential elements and steps described herein, as well as any additional or optional ingredients, components, or limitations described herein or otherwise useful in analytical electrochemistry.

EDL=electrochemical double layer. EIS=electrochemical impedance spectroscopy. GCS=Gouy-Chapman-Stern. PZC=potential of zero charge. RC=resistance×capacitance.

BRIEF DESCRIPTION OF DRAWINGS

FIG. 2A illustrates schematically how the capacitor 10 is replaced with the electrochemical cell 12, wherein the frequency generated by the EDL is amplified and output to a speaker. FIG. 2B shows the same circuit in slightly more detail, with the electrochemical cell 12 presented in the form of a capacitor surrounded by broken lines.

FIG. 4A: 7 mM $KClO_4$ Pt electrode vs potential. FIG. 4B: Effect of changing electrolyte concentration. FIG. 4C: Effect of decreasing cation radius. FIG. 4D Effect of using a strongly adsorbing anion. Error bars indicate one standard deviation above and below the average frequency value.

FIG. 9 graphs the transient frequency of the EDL versus time when voltage was changed from 1.0V to 1.1V vs Ag/AgCl on a Pt electrode in 7 mM $KClO_4$.

FIG. 10A is a graph of transient frequency versus time of a Pt electrode in 5 mM $KClO_4$ from 0 V to 0.1 V; the trace does shows a small drop (<10 Hz) due to the lack of oxide presence. FIG. 10B shows the same graph when voltage was swept from 0.4V to 0.5V (the voltage at which the oxide lawyer is formed). Here, a steep drop in frequency is observed during the voltage change, indicating a faradaic process, the time-dependence of which is observable in the data.

DETAILED DESCRIPTION OF THE INVENTION

Figure 1:
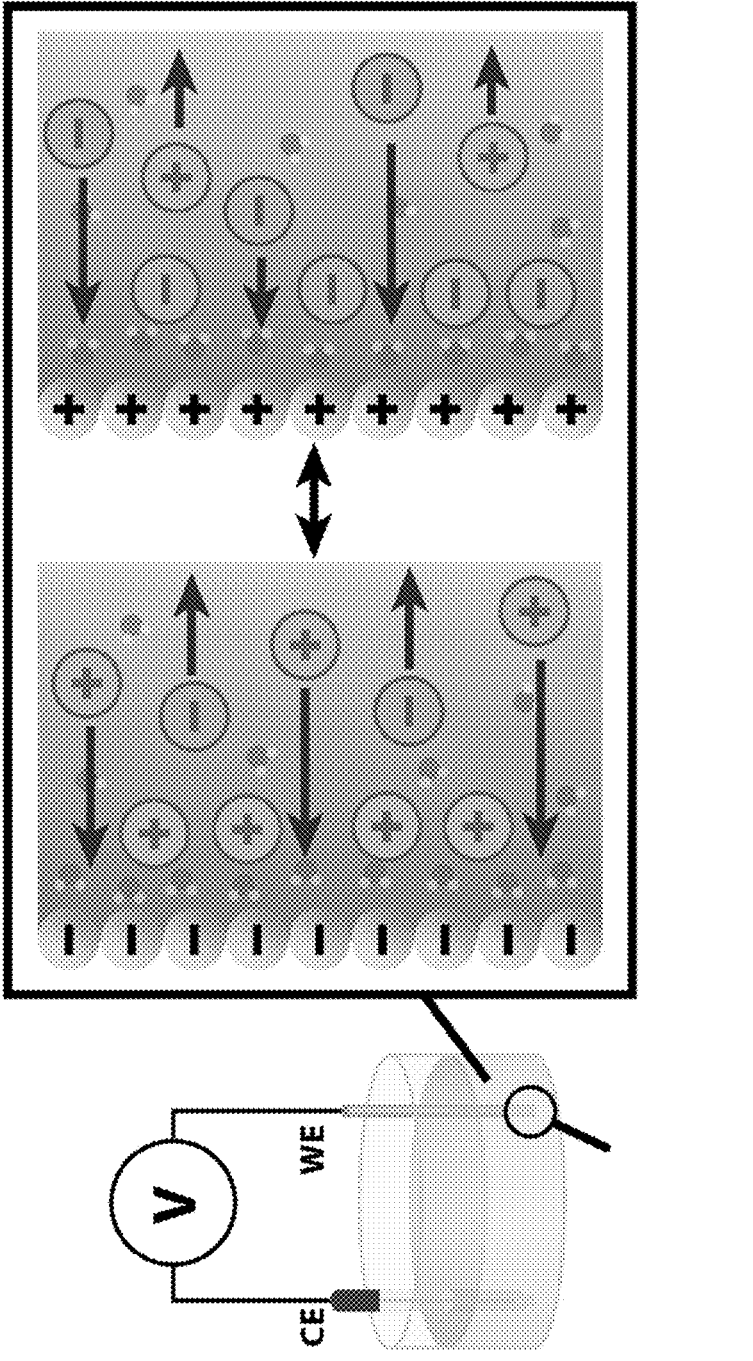
FIG. 1 is a schematic diagram of ion rearrangement at the electrochemical double layer ("EDL") leading to audible frequencies after being coupled with the circuit shown in FIGS. 2A and 2B.
Figure 2A:
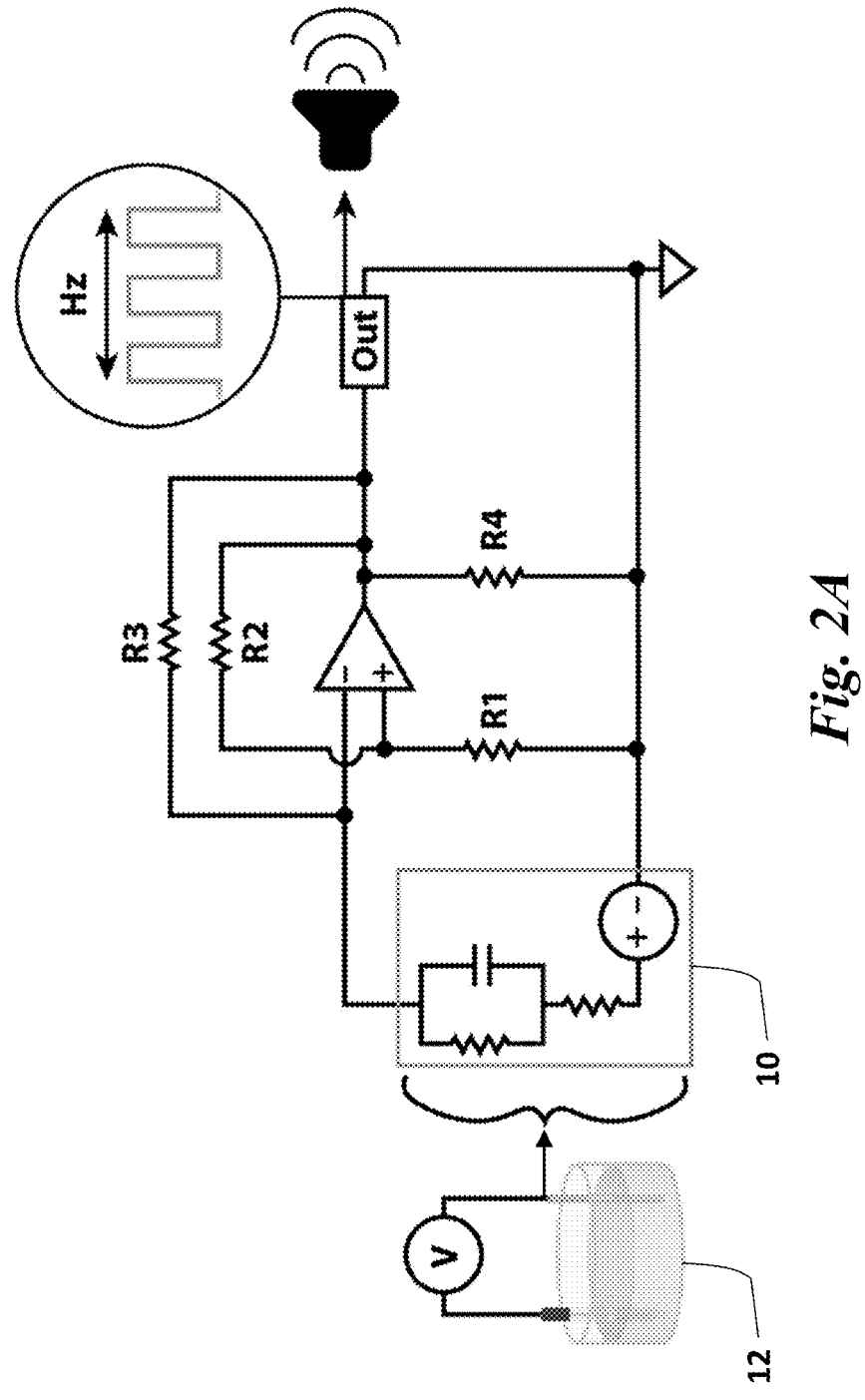
FIGS. 2A and 2B are exemplary circuit diagrams of the astable multivibrator disclosed herein. The circuit may be used in conjunction an electrochemical cell 12 powered by a DC voltage power supply "V" for the capacitor.
Figure 2B:
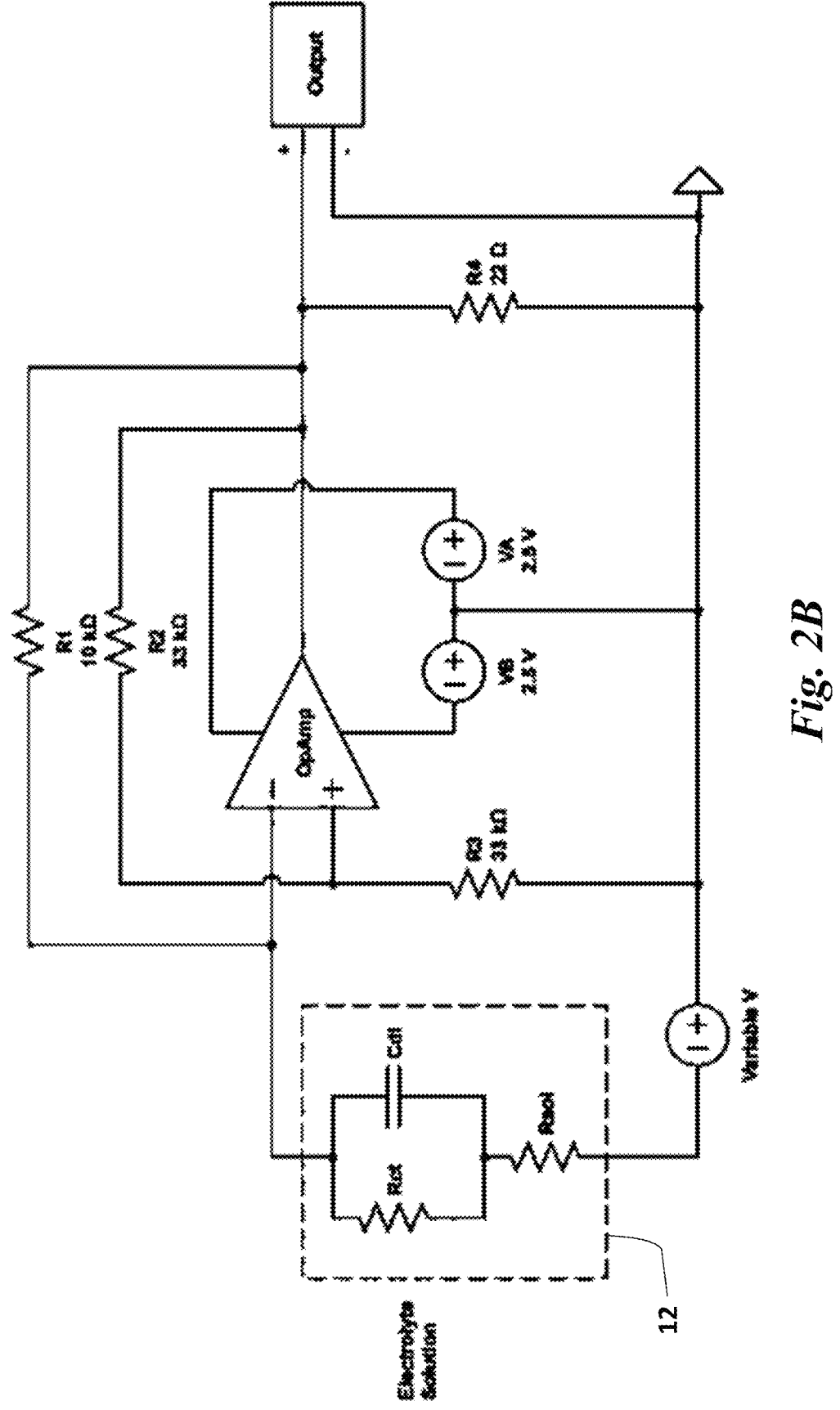

Verification of EDL Behavior as a Capacitor:

The frequency of the square wave function generated at the output of the operational amplifier (FIG. 2A, circled inset at upper right) is governed by the RC time constant of the resistor and capacitor in series. In the circuit shown in FIGS. 2A and 2B, the capacitor 10 (FIG. 2A) is replaced with an electrochemical cell 12 (FIG. 2A), which has been modeled as a simplified Randles circuit, as shown in FIGS. 2A and 2B. (Randles, J. E. B. (1947) "Kinetics of rapid electrode reactions," *Discussions of the Faraday Society* 1: 11.) The electrochemical cell 12 has both a solution resistance and charge transfer resistance but resistances are negligible relative to the 10 kΩ resistance of $R_3$ (FIG. 2B). This allows for variations in the square wave frequency to be attributed to changes in the capacitance of the electrochemical cell 12, as R can be considered essentially constant.

The circuitry was verified by monitoring the change in square wave frequency with variation in capacitance. As shown in Equations 1 and 2, the output frequency of an astable multivibrator circuit is linearly proportional to the inverse of the capacitance. Replacing the capacitor with an electrochemical cell results in the frequency being linearly proportional to the inverse square root of concentration according to the Gouy-Chapman Stern model (Bard & Faulkner, 2001). The expected linear dependence was observed in both cases, as shown in FIGS. 3A and 3B, indicating the circuit oscillates as expected.

$$f = \frac{1}{2RC \times \ln\dfrac{1+\beta}{1-\beta}} \propto \frac{1}{C} \qquad \text{(Eq. 1)}$$

$$\beta = \frac{R_2}{R_1 + R_2} \qquad \text{(Eq. 2)}$$

Figures 3A, 3B:
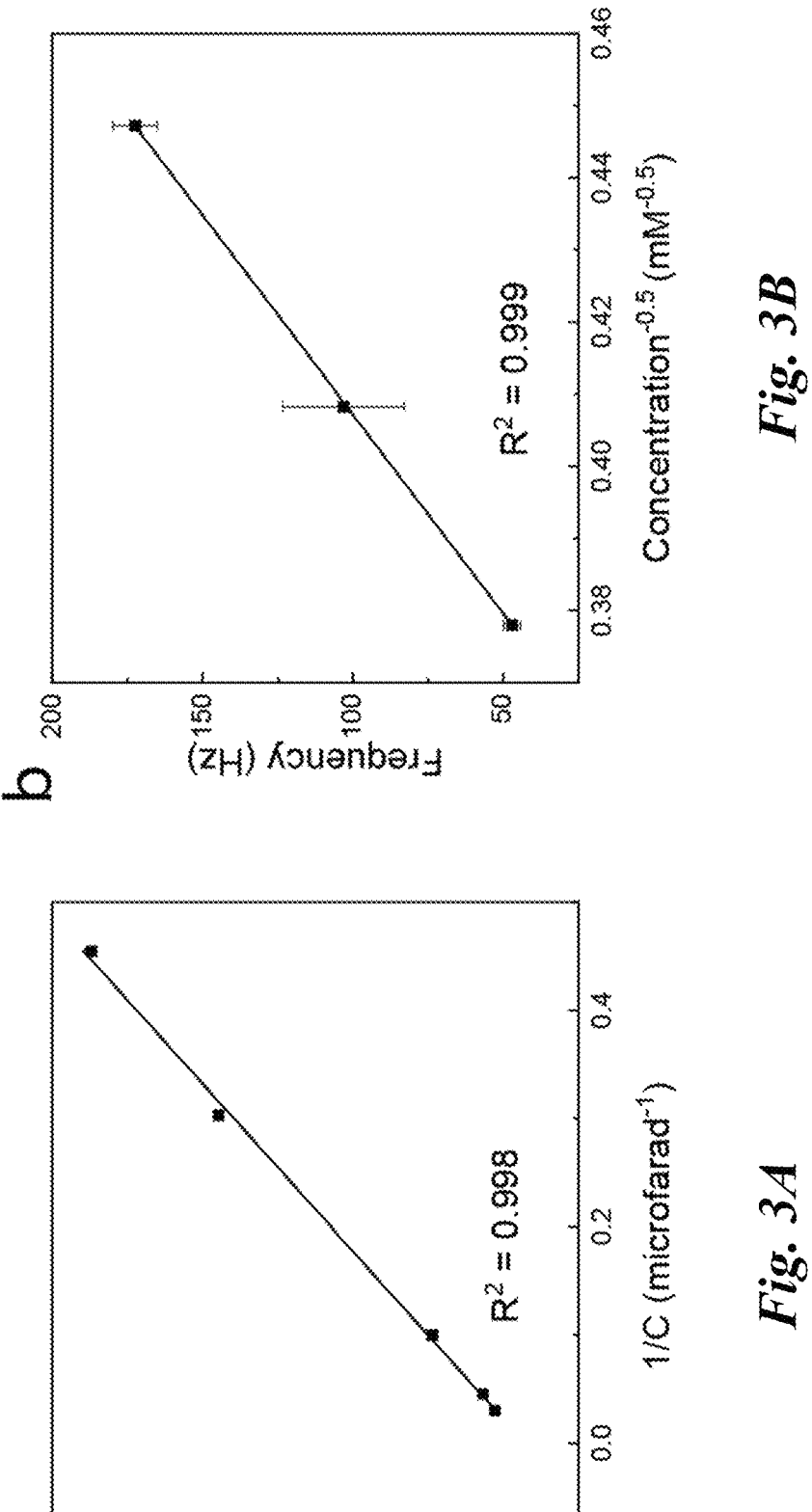
FIG. 3A is a graph of frequency vs 1/C. The graph has a linear slope, verifying that the circuit shown in FIGS. 2A and 2B works as an astable multivibrator with a standard capacitor.
FIG. 3B is a graph of frequency vs 1/sqrt(concentration). This graph is also linear, indicating the circuit shown in FIGS. 2A and 2B continues to behave as an astable multivibrator with the capacitor replaced with a the EDL of an electrochemical cell.

FIG. 3A shows the frequency of the EDL versus 1/C has a linear slope, thus verifying that the circuit works as an astable multivibrator with a standard capacitor. As shown in FIG. 3B, the graph of the frequency of the EDL versus the inverse square root of the concentration of the electrolyte (in mM) is also linear, indicating the circuit continues to behave as an astable multivibrator with the capacitor replaced with an electrochemical cell.

To demonstrate the ability of the electrochemical oscillator circuit to monitor EDL behavior, the parameters of the electrochemical cell were varied, and the resulting responses in frequency were compared to established EDL theory.

Figure 4B:
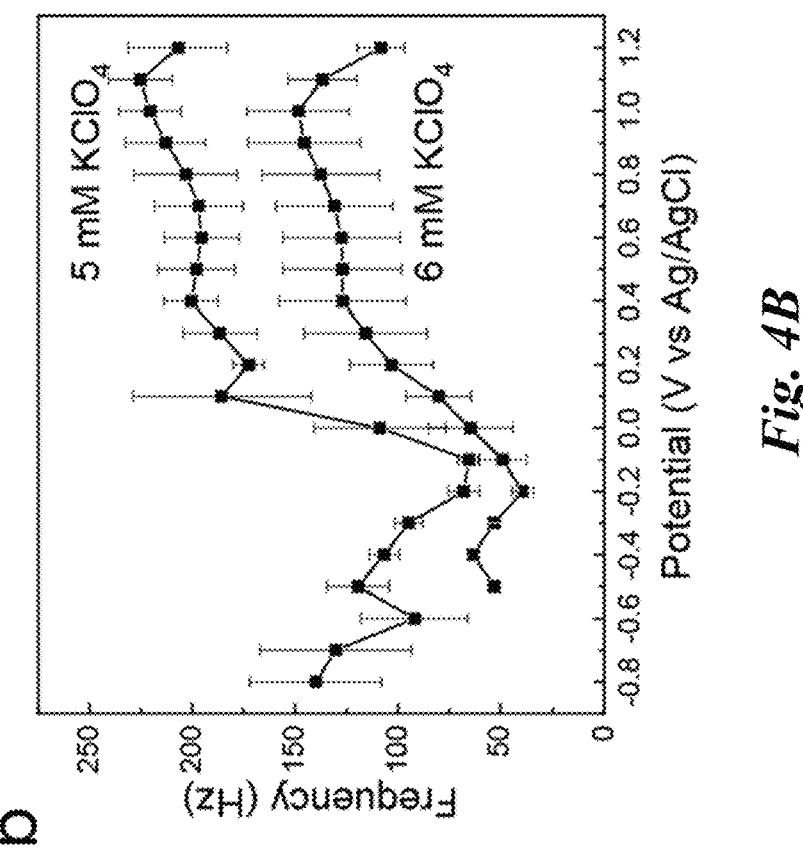
FIGS. 4A, 4B, 4C, and 4D are graphs showing that the frequency generated by the EDL depends on the electrochemical cell conditions.
Figure 4A:
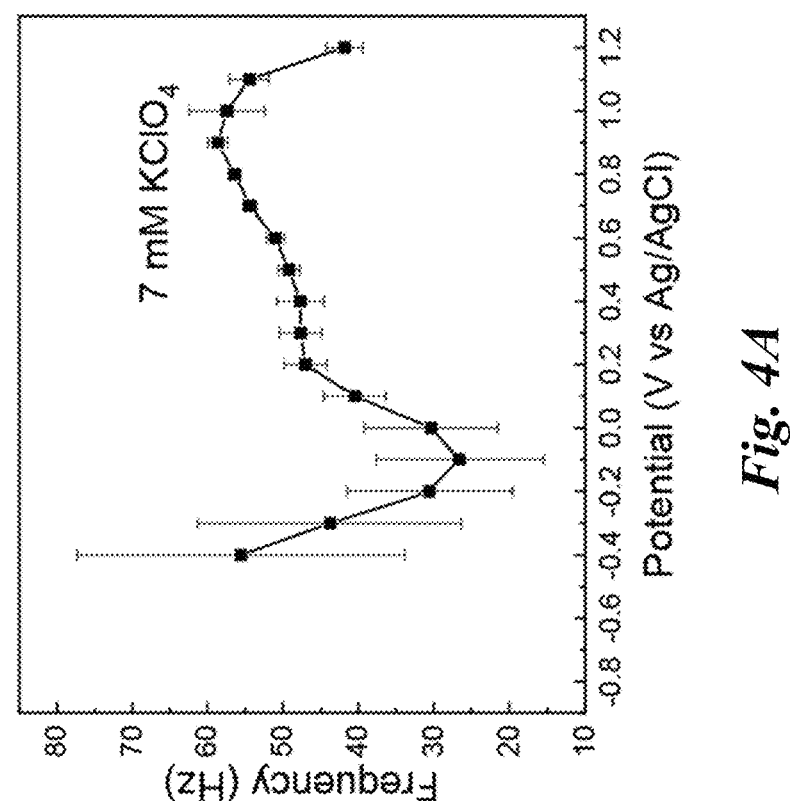
Figure 4D:
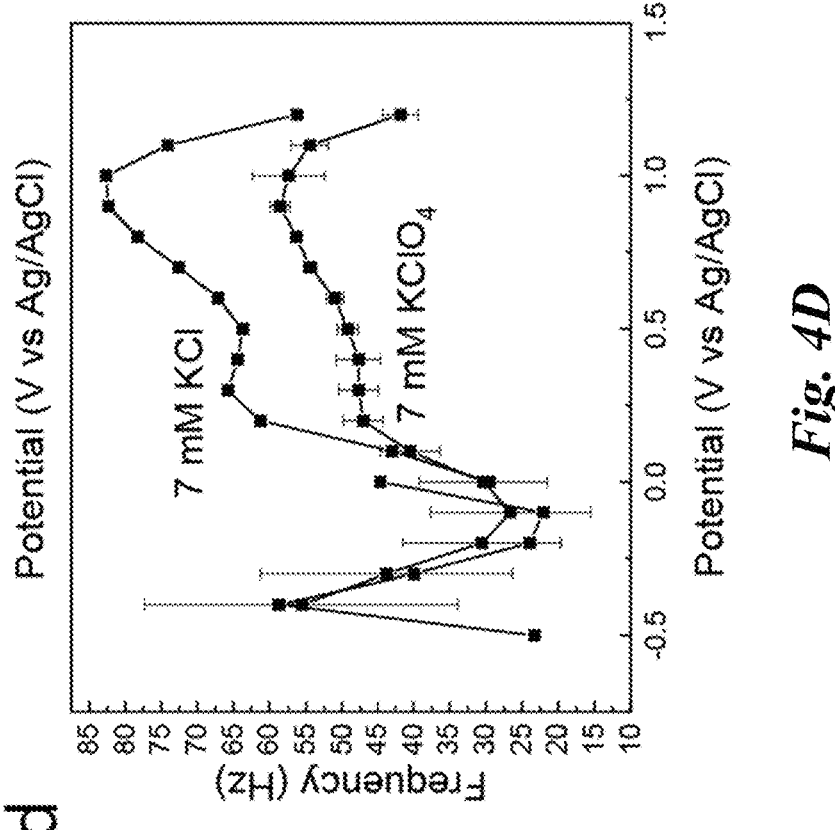
Figure 4C:
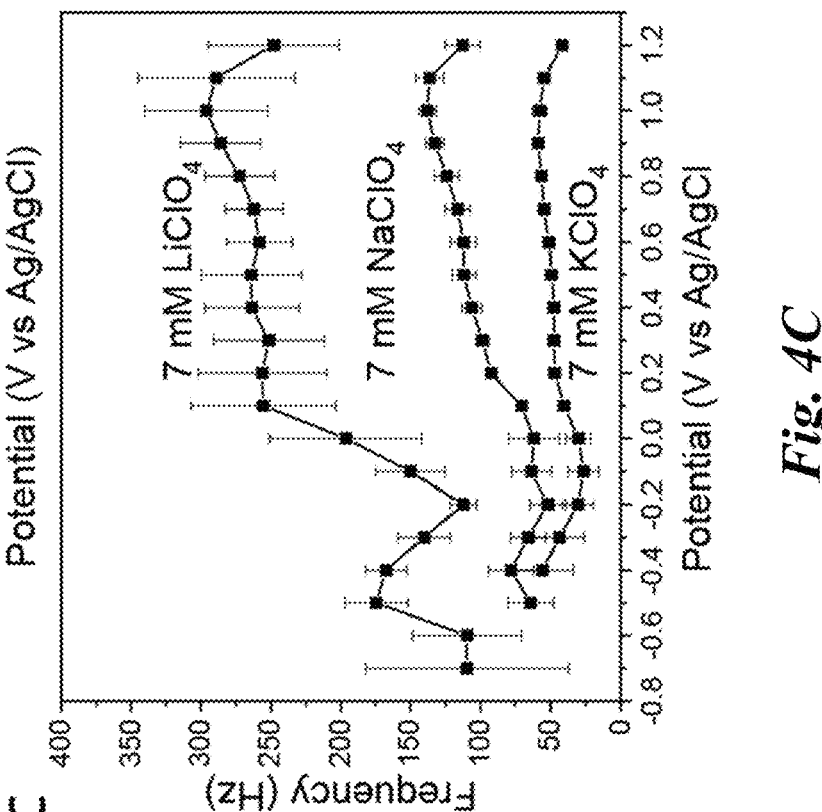

FIGS. 4A, 4B, 4C and 4D establish that the frequency of the EDL depends upon the conditions of the electrochemical cell. Thus, FIG. 4A graphs the frequency of the EDL in a solution of 7 mM $KClO_4$ Pt electrode vs potential. The impact of changing the electrolyte concentration is shown in FIG. 4B (top trace=5 mM $KClO_4$; middle trace=6 mM $KClO_4$; bottom trace=7 mM $KClO_4$). The frequencies are easily distinguished based on electrolyte concentration. The effect of increasing cation radius is shown in FIG. 4C. Here, the concentration of the electrolyte was held constant 7 mM and the anion was $ClO_4$. But the cation was varied from lithium (smallest radius) to sodium (larger radius) to potassium (largest radius). The results followed suit as shown in FIG. 4C, wherein top trace=$LiClO_4$; middle trace=$NaClO_4$; and bottom trace=$KClO_4$. FIG. 4D shows the effect of using a strongly adsorbing anion (chloride; upper trace) versus a non-adsorbing anion (perchlorate; lower trace) in the electrolyte solution. Error bars in FIGS. 4A-4D indicate one standard deviation above and below the average frequency value.

Frequency Dependence on Applied Potential:

By using the EDL as a capacitor in an astable multivibrator circuit, changes in capacitance can be easily observed in real-time across a wide range of potentials simply by varying the DC voltage supplied to the working electrode in the cell. (See FIG. 2A at 12 and "V".) The expected trends for the capacitance based on GCS theory would be a minimum at the potential of zero charge ("PZC"), and asymmetric behavior on either side due to the different size of the cation and anion. For frequency, a peak at the PZC is predicted due to the inverse relationship between frequency and capacitance. (Bard & Faulkner, 2001) Interestingly, as shown in FIG. 4A, performing an oxidative sweep from 0 to 1.2 V vs Ag/AgCl results in an increase in frequency up to 0.2 V, and then a plateau until the frequency decreases at 1.0 V vs Ag/AgCl. The frequency at 0.2 V vs Ag/AgCl is close to reported values of the PZC for various platinum electrode facets, (Lust, 2018; Petrii, 2013) thus the increase in frequency from 0 to 0.2 V matches the expected behavior. Without being limited to any underlying mechanism or phenomenon, the working hypothesize is that the plateau in frequency from 0.2 to 1.0 V is due to the formation of platinum-oxygen bonds which provide a means for the electrode potential to drop across the bonded oxygens.

Negative of the PZC, the frequency increased from −0.2 V to −0.4 V vs Ag/AgCl to a value like that observed near the PZC. Pt is known to be highly active for hydrogen evolution at reductive potentials. Thus, it is likely that hydrogen was adsorbed onto the electrode surface at these potentials, once again decreasing the effective potential difference experience at the electrolyte, resulting in fewer cations migrating towards the electrode. As a result, the capacitance would decrease, thus explaining the observed increase in frequency.

Figure 5B:
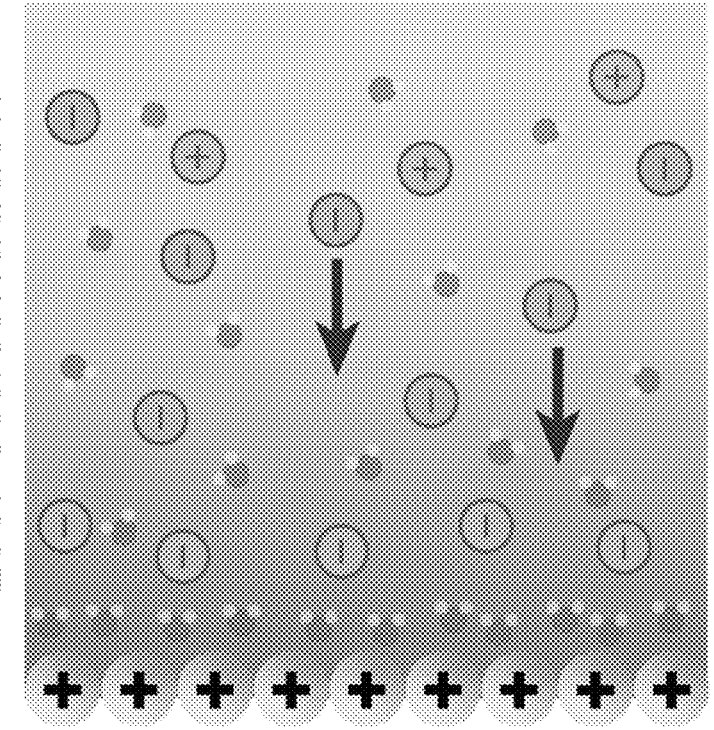
FIGS. 5A and 5B are visual representations of how low-concentration solutions (FIG. 5B) have fewer ions available to migrate toward the electrochemical double layer for a given potential drop as compared to high-concentration solutions (FIG. 5A), resulting in less charge buildup at the double layer and thus a lower capacitance.
Figure 5A:
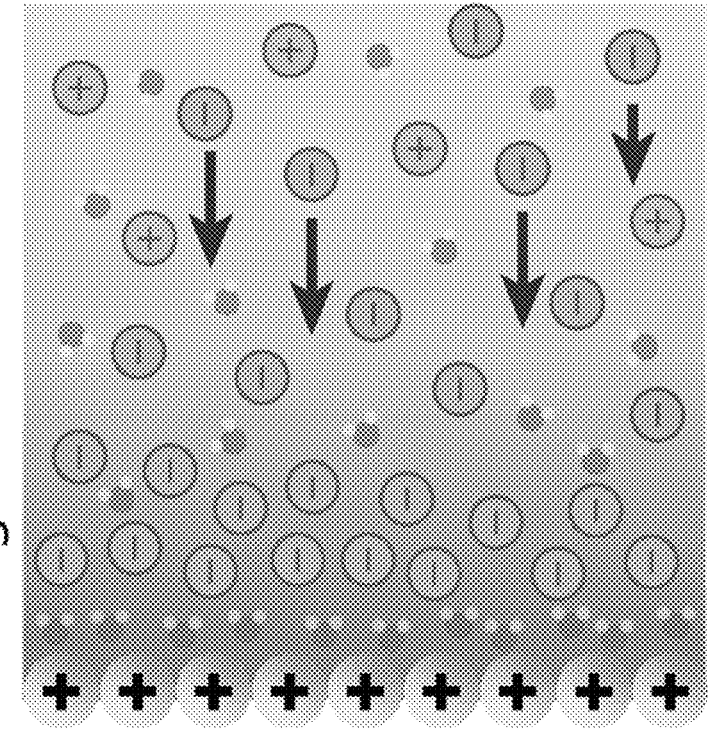

Frequency Dependence on Electrolyte Concentration:

As shown in FIG. 4B, decreasing the concentration of $KClO_4$ from 7 mM to 5 mM caused an increase in frequency. This is expected because in a system of lower concentration, there are less ions in solution available to migrate towards the EDL and store charge. This results in a less compact Hemholtz layer, and thus less charge density near the electrode surface (Bard & Faulkner, 2001; Damaskin & Petrii, 2011). This phenomenon is illustrated schematically in FIGS. 5A (high concentration) and 5B (low concentration). As illustrated in these two figures, low concentration solutions (FIG. 5B) have fewer ions available to migrate toward the double layer for a given potential drop, resulting in less charge buildup at the double layer and thus a lower capacitance. This reduces the capacitance of the double layer and causes the circuit to oscillate faster. For a given potential, the frequency for a lower concentration solution should be higher, which is observed. Furthermore, as the concentration becomes more dilute, the increase in frequency between 0 to 0.3 V becomes more pronounced. This increase in frequency corresponds to a decrease in capacitance. The capacitance is expected to be at a minimum at the PZC of an electrode (Damaskin & Petrii, 2011), which for polycrystalline Pt has been reported to be between 0.1 and 0.3V (Carr & Hampson, 1972; Lust, 2018; Pajkossy, 1994; Petrii, 2013). In dilute electrolyte solutions, the decrease in capacitance near the PZC is more pronounced because the capacitance of the diffuse layer contributes more to the overall capacitance of the double layer. This trend is reflected in the increasingly sharp rise in frequency near the PZC for polycrystalline Pt as the electrolyte is diluted from 7 mM to 5 mM $KClO_4$.

Figures 6A, 6B:
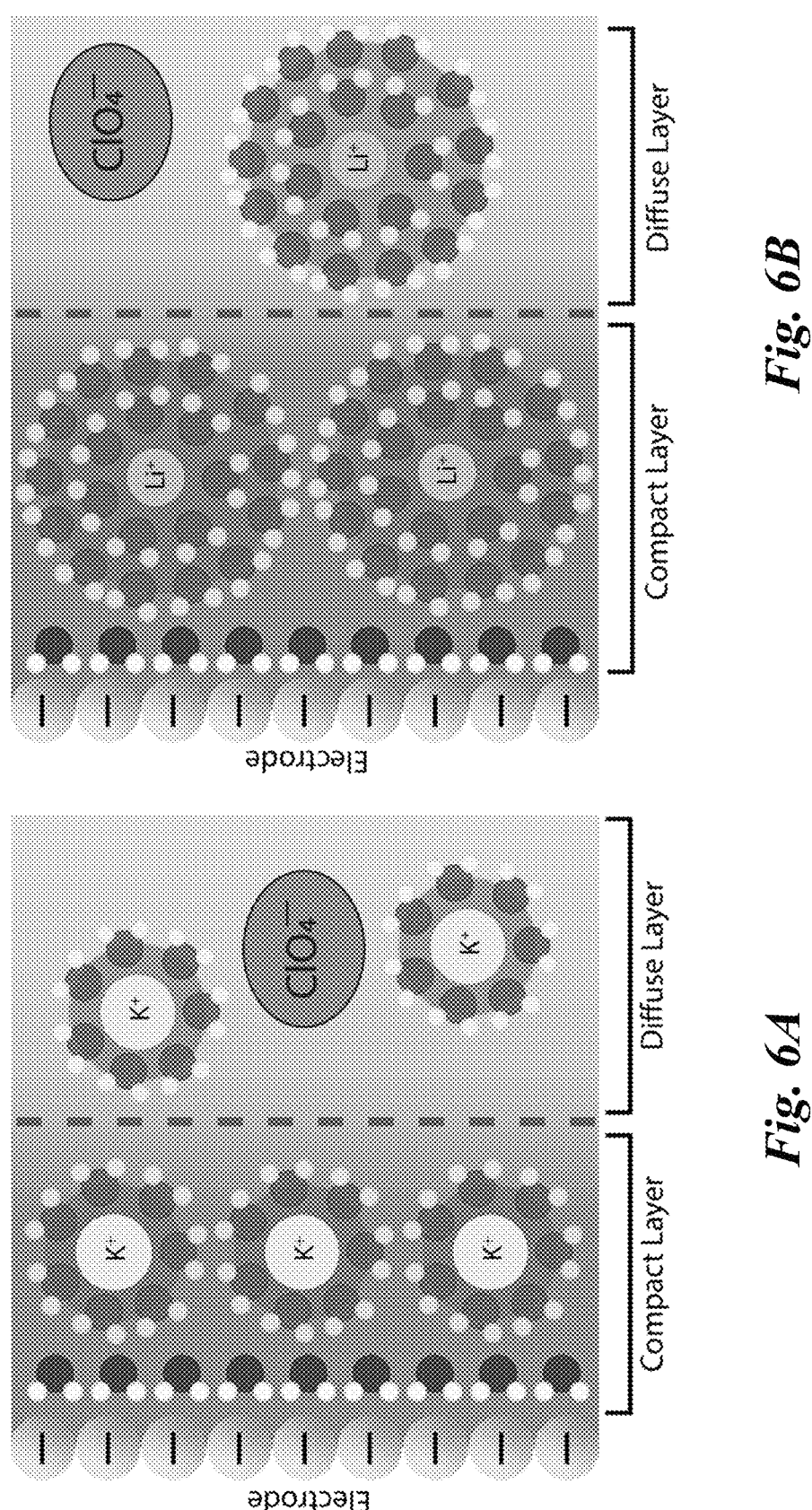
FIGS. 6A and 6B are visual representations showing that as cation radius decreases from K+(FIG. 6A) to Li+(FIG. 6B), the solvation shell of the ion increases. This solvation shell introduces more steric hindrance at the EDL, reducing the amount of charge that can be stored at the double layer. This results in a decrease in capacitance, which is measured with the oscillator circuit as an increase in frequency.

Frequency Dependence on Cation Size:

The size of the solvation shell surrounding a cation also impacts the frequency. Cation radius and solvation shell size are inversely proportional. Thus, as the cation size decreases from $K^+$ to $Na^+$ to $Li^+$, the solvation shell increases. (Bard & Faulkner, 2001) With a larger solvation shell, there is more steric hindrance at the EDL, and less charge can accumulate at the interface. This trend is reflected in the increase in frequency with decrease in cation radius as shown in FIG. 4C. The overall potential dependence trends remain largely the same. This can be explained by the fact that alkali metal cations do not strongly interact with Pt electrode surfaces. Thus, the dominating effect in the frequency variation is the vertical shift upwards with increasing solvation shell size and subsequent steric repulsion at the interface. This phenomenon is illustrated in FIG. 6A ($K^+$ is the cation, larger ionic radius, but smaller solvation shell) and FIG. 6B ($Li^+$ is the cation; smaller ionic radius, but larger solvation shell). As the cation radius decreases from $K^+$ to $Li^+$, the solvation shell of the ion increases. This solvation shell introduces more steric hindrance at the EDL, reducing the amount of charge that can be stored at the double layer. This results in a decrease in capacitance, which is measured with the oscillator as an increase in frequency. Thus, as shown in FIG. 4C, the cell containing $LiClO_4$ resonates at higher frequencies than does the cell containing $KClO_4$ at all applied potentials.

Figure 7B:
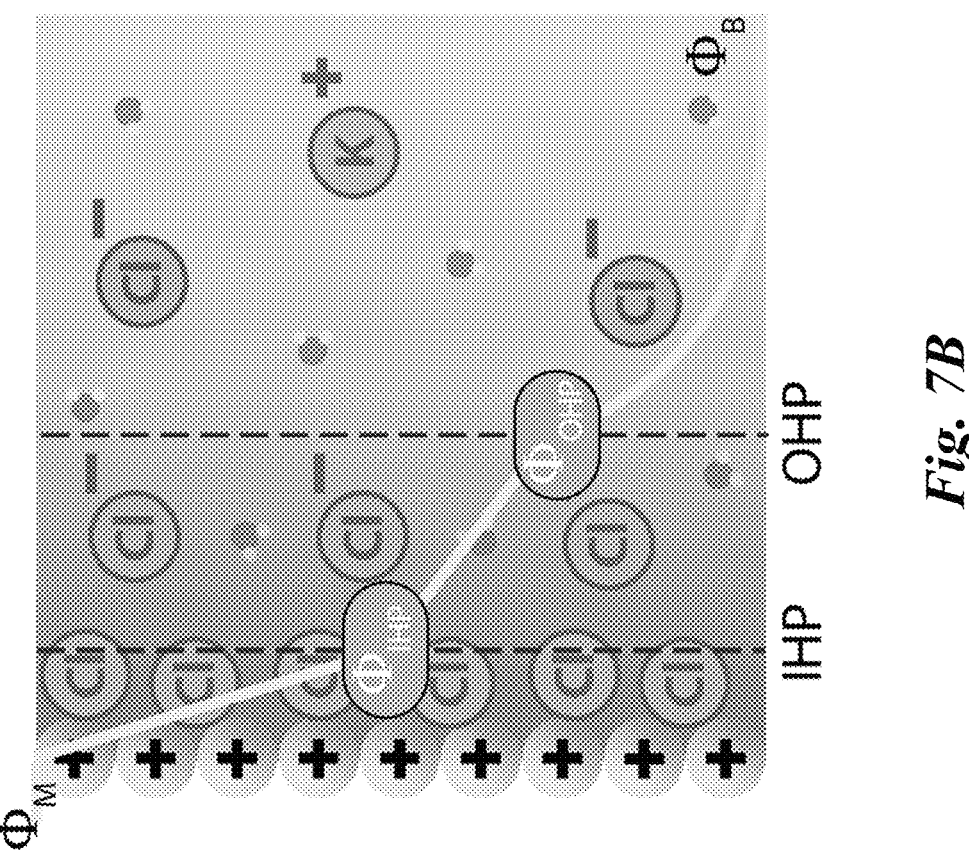
FIGS. 7A and 7B are graphical depictions of adsorbed chloride ions (FIG. 7B) providing a pathway for larger potential drop across the inner Hemholtz plane (IHP) as compared to FIG. 7A (without adsorbed chloride ions), resulting in an outer Hemholtz plane (OHP) potential that is much closer to the bulk solution potential, resulting in less chloride ion migration and less capacitance.
Figure 7A:
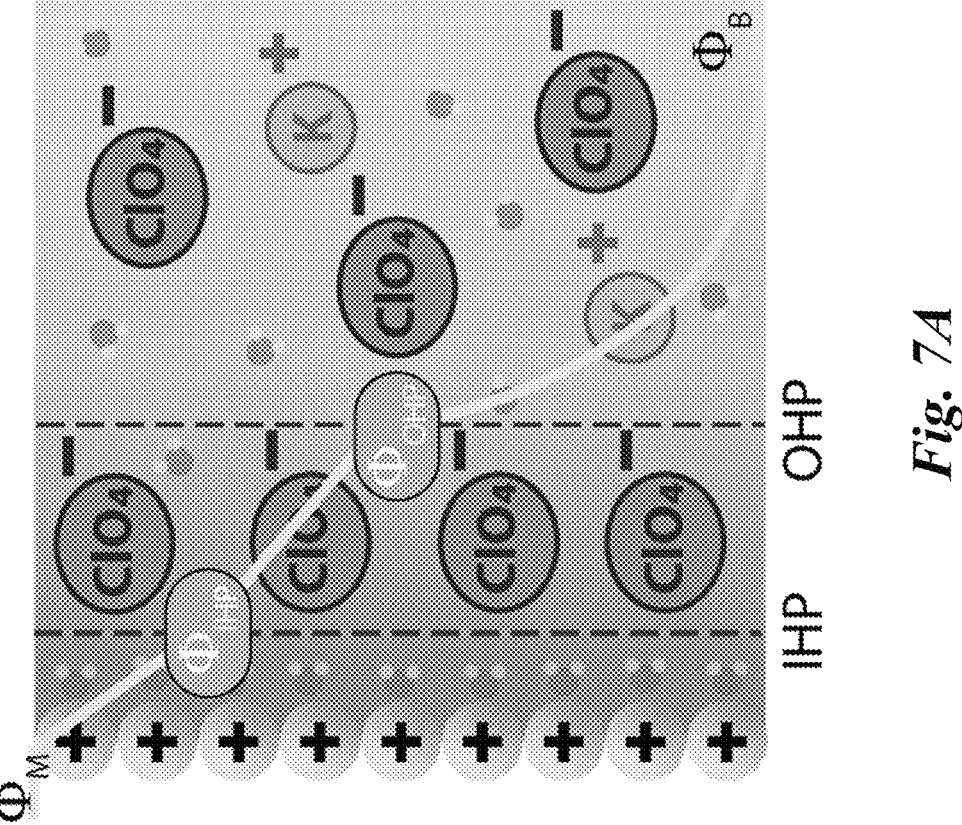

Frequency Dependence on Anion Identity:

The degree to which the anion interacts with the electrode can be seen through the change in capacitance of the EDL. $ClO_4$ is generally regarded as a non-interacting anion (Bard & Faulkner, 2001); thus it will not strongly adsorb onto the surface. $Cl^-$ however, is known to strongly interact with Pt electrodes and adsorb onto the surface (Conway & Novak, 1979; Pajkossy & Kolb, 2008). If a species is adsorbed onto the electrode surface, a surface dipole is generated, which provides a pathway to decrease the potential drop between the electrode and the electrolyte because some of the potential is being dropped across the adsorbed species. Consequently, fewer charges from the electrolyte migrate towards the electrode, resulting in a decrease in capacitance. This trend is reflected in the increase in frequency for the 7 mM KCl solution relative to the 7 mM $KClO_4$ shown in FIG. 4D. Additionally, the increase in charge is most clearly observed at potentials greater than 0.2V vs Ag/AgCl. 0.2V vs Ag/AgCl is close to the literature value for the potential of zero charge (PZC) of polycrystalline platinum. At potentials positive of the PZC, anions will be traveling towards the double layer, thus the impact of an adsorbed anion will be most clearly observed at these potentials. The phenomenon is illustrated schematically in FIG. 7A ($ClO_4$; non-adsorbing) versus FIG. 7B (CI; adsorbing). The adsorbed chloride ions (FIG. 7B) provide a pathway for a larger potential drop across the inner Hemholtz plane ("IHP"), resulting in an outer Hemholtz plane ("OHP") potential that is much closer to the bulk solution potential, resulting in less chloride ion migration and less capacitance. The frequency of the system follows the expected behavior, illustrating how the novel method disclosed herein provides novel, sensory insight into the double layer in real time.

Figure 8:
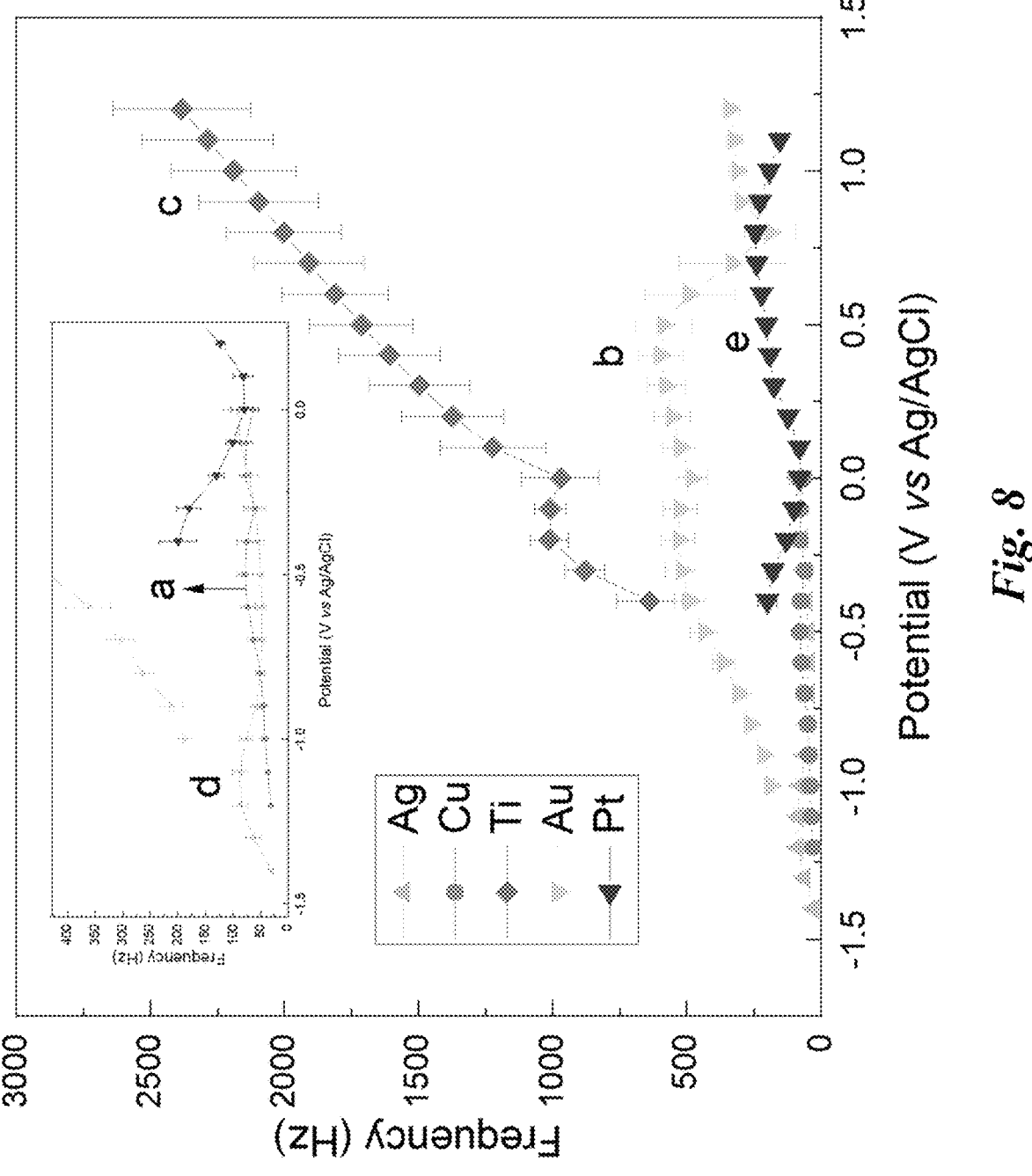
FIG. 8 is a graph showing frequency vs. voltage behavior of various electrodes in 3.5 mM $NaClO_4$. It shows that the circuit and method disclosed herein can be used to identify properties of the electrode material itself. Trace (a)=Cu. Trace (b)=Au. Trace (c)=Ti. Trace (d)=Ag. Trace (e)=Pt.

Frequency Dependence on Material:

The resulting change in frequency upon changing the electrode material underscores the complexity of the double layer behavior. A main approach to tuning electrocatalytic reactions is through the selected electrode material. Therefore, the frequency behavior of three other commonly used electrocatalytic metals, Cu, Ag and Au was studied. Titanium was also studied because it is known to form surface oxides quickly. The impact of surface oxide formation on EDL structure remains a topic of keen interest in electrocatalysis. The materials data scans are shown in FIG. 8. Copper was polarizable from 0 to −1.2V vs Ag/AgCl, a range similar to those reported in previous literature studies (Armstrong et. al., 1969). The local maxima frequency peaks at −0.2V vs Ag/AgCl and −0.5V vs Ag/AgCl roughly correspond to local capacitance minima peaks observed in a study with a Cu electrode in 0.2M $NaClO_4$ electrolyte. These local minima were hypothesized to be related to the formation of a CuH compound prior to hydrogen evolution. Exact analysis and comparison of peaks and trends between studies is difficult due to variations in electrode preparation and electrolyte solutions, all of which have significant impact on the behavior. Silver and gold exemplify the complexity of these systems, as for both materials, the ranges of polarizability, which for this system is indicated by oscillation of the circuit, mostly matched the ranges observed in literature (Hampson et. al., 1967; Stolberg et. al., 1986). However, the observed minima and maxima in the trends were not well matched by existing studies. These differences may be attributed to possible organic impurities and differences in electrode surface preparation. Despite discrepancies within trends, qualitatively, changing the electrode material demonstrates how the electrochemical oscillator is a powerful tool to conceptualize the double layer in a tangible manner. Each electrode material had a distinct frequency and dependence on potential that were reproducible within the system. Hearing how the different electrode generate different sounds allows tangible insight into how the EDL can be tuned and adjusted. In addition to responding to changes in the electrode material, the oscillator also reflects the impact of surface oxide formation. Titanium demonstrated a continuous increase in frequency from 0 to 1.2V vs Ag/AgCl. This matches the continuous decrease in capacitance observed in literature due to the formation of $TiO_2$ on the electrode surface (Hurlen & Wilhelmsen, 1986). This is logical, because similar to the increase in frequency observed in KCl, potential is dropped across the oxide layer, resulting in a lower potential difference between the electrode surface and solution, thereby generating less charge migration and a higher frequency.

EXAMPLES

The following examples are non-limiting. They are presented solely to provide a more complete description of the method and device disclosed and claimed herein. One aspect of the method is a sensory, audible way to monitor the behavior of electrochemical double layers ("EDL") by bringing them into spontaneous oscillation. In this configuration, the resonance frequency is highly sensitive to interface properties such as the identity of anions, cations, the solvent, adsorbates on the surface, the temperature, mass transport in solution, etc. As such, the apparatus provides extremely sensitive insight into properties of the EDL. The apparatus itself can be made from off-the-shelf electronics, and is thus extremely cost-effective. When the resonance frequency of the EDL is in the audible range, the method provides a direct avenue literally to sense (i.e., to hear directly with the human ear) changes to interface properties through an audible signal.

In these examples, a modified multivibrator circuit as shown in FIGS. 2A and 2B was used to drive the EDL into resonance by varying the voltage applied to the electrochemical cell. As shown in FIG. 2B, the electrochemical cell that acts as a capacitor is surrounded by a broken line at the left-hand side of FIG. 2B. The electrochemical cell behaves as a capacitor, charging and discharging with a certain frequency that depends on the ionic configuration at the EDL and the electrode material. In these examples, the cell was designed such that the frequency generated was within the audible range for the human ear. The remaining circuitry is dimensioned and configured to amplify the frequency generated at the EDL using an operational amplifier ("OpAmp" at the center of FIGS. 2A and 2B) and to output the amplified signal. When the output is connected to a speaker (FIG. 2A), this generates an audio output that changes pitch based on EDL rearrangements. The sound heard is reflective of the ions rearranging at the electrode-electrolyte interface, thus providing unprecedented insight into molecular-scale behavior. The system is customizable by changing the electrodes, electrolytes, and solvents used. The frequency of the EDL is tracked in real time and can reveal behaviors such as oxide formation and reductions on the electrode surface. As parameters in the system are changed, the frequency responds according to electrochemical principles, allowing for the reporting of EDL trends for a given system.

The method can analyze electrolyte properties and the properties of the electrochemical double-layer. For example, the time-constant of double-layer rearrangement, which determines the oscillation frequency, depends on the concentration, solvation, identity, and molecular interaction between solvent ions and solvent molecules. As such, the resonance frequency provides direct evidence of the composition of the EDL at the molecular level and the interactions between its constituent components. For example, the method has been used to show that the resonance frequency depends on the concentration of electrolyte ions and the identity of electrolyte cations. The method thus can be used to investigate a molecular environment that has to date proven resistant to analysis and investigation.

The method furthermore allows for identifying properties of the electrode material. For example, the method has been used to prove that the resonance frequency is strongly dependent on the electrode material. See FIG. 8. Thus, FIG. 8 provides insight into the thermodynamics of the interaction between the electrode and the electrolyte.

Figure 9:
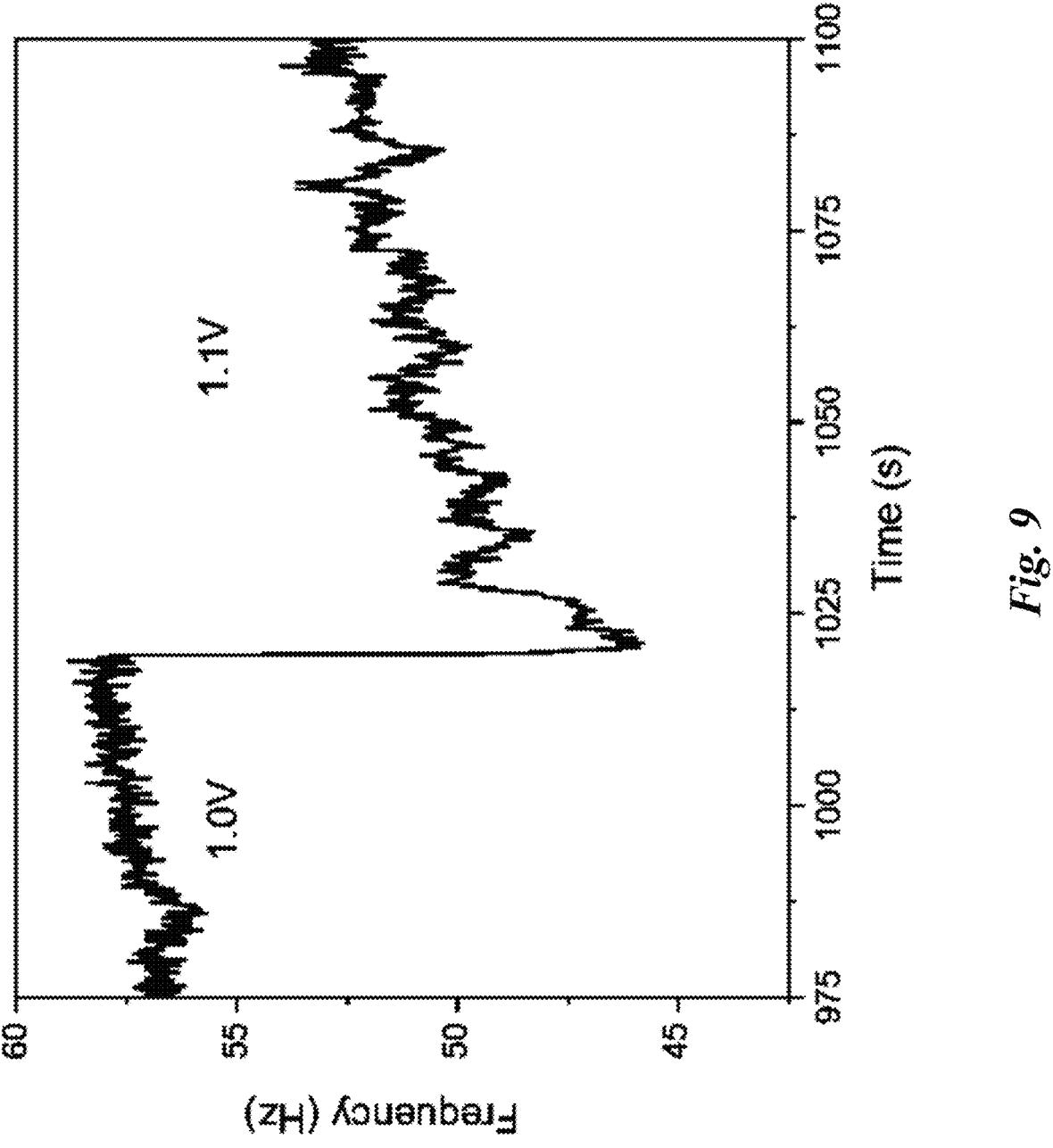
FIG. 9 is a graph showing that the method disclosed herein can be used to measure time-dependent properties of EDLs.

Importantly, the method shows sharp transient time-dependent changes in resonance frequency upon applying potential steps, which represent the dynamics of EDL rearrangement in real time. To date, no methods with the necessary time resolution exist to observe these dynamics in real time. As such, the method has wide-ranging importance to the measurement of time-dependent double-layer properties. These effects are illustrated in FIG. 9, which show the dynamics observed upon moving from 1.0V to 1.1V vs Ag/AgCl on a Pt electrode in 7 mM $KClO_4$. As shown in the figure, this step up in voltage resulting in a pronounced frequency drop in the EDL.

Figures 10A, 10B:
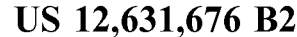
FIGS. 10A and 10B show that the method can be used to monitor changes to the electrode surface.

The method is also able to monitor changes to the electrode surface. For example, the formation of oxide layers on the surface of electrodes is directly reflected in changes in the resonance frequency. This can be seen in FIGS. 10A and 10B. FIG. 10A shows transient frequency data of a Pt electrode in 5 mM $KClO_4$ as voltage was swept from 0V to 0.1V. The trace in FIG. 10A does show a small drop (<10 Hz) due to the lack of oxide presence. Compare FIG. 10A to 10B, though, wherein the voltage was swept from 0.4V to 0.5V—an identical 0.1V increase. However, the voltage applied in FIG. 10B is in the region of oxide formation. The corresponding signal shows a very pronounced, steep drop in frequency during the voltage change, indicating a faradaic process. The time-dependence of faradaic reaction is observable in the data presented in FIG. 10B.

The method is used to investigate and measure a vast range of EDL properties. For example, the method can be used to measure the local temperature of double layers because the double layer rearrangement dynamics, which underly the resonance frequency, are temperature dependent (per the Gouy-Chapman-Stern model). (See, for example, K. B. Oldham (2008) "A Gouy-Chapman-Stern model of the double layer at a (metal)/(ionic liquid) interface," J. Electroanalytical Chem. 613(2):131-138.) This has wide-ranging consequences for understanding the molecular-level processes occurring at electrochemical interfaces, where local temperature measurements have thus far not been possible.

The method is also highly sensitive to the identity of adsorbates at electrode surfaces. Thus, the method can be used to determine the coverage of adsorbates in real time through frequency changes. This is because adsorbates such as CO, $CO_2$, Cl—, CN—, etc. introduce surface dipoles, which change the potential drop in the double-layer, which in turn directly impacts the oscillation frequency.

The method can also be used to probe the transient kinetics of accumulation and consumption of electrocatalytic intermediates such as CO during CO oxidation, $CH_4$ during methane oxidation, and $CO_2$ during $CO_2$ reduction, by following the transient changes in resonance frequency upon applying a potential step. The changes in surface dipoles enables the method to observe whether electrolyte components remain in solution or adsorb to the electrode surface. For example, the method can be used to measure the adsorption (or non-adsorption) of imidazolium cations during electrocatalytic reactions.

The method can also be used to gain insight into the impact of solvent properties on solvation. For example, the capacitance of the double-layer will likely be decreased for a constant anion and cation type and concentration upon introducing an additive or solvent, which leads to a larger solvation shell for the ions contained in the double-layer.

The method can also be used to measure the formation of solid electrolyte interphase (SEI) layers in batteries in real time, and to monitor the health of batteries and SEI layers especially during battery operation.

Numerous other electrochemical effects, electrolyte structure effects, and surface effects can be probed by the method disclosed herein and be made audible by human ears.

Figure 11:
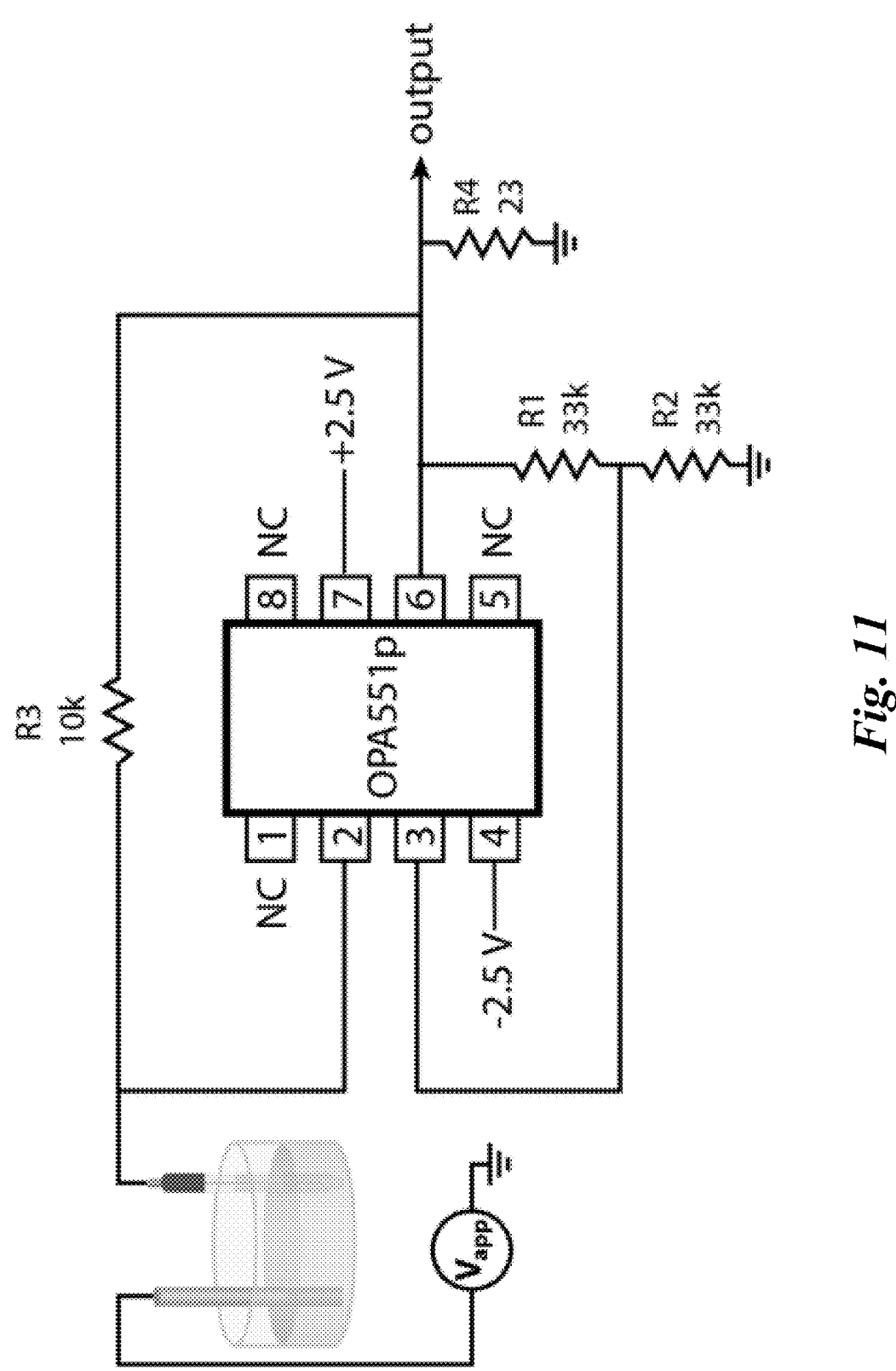
FIG. 11 is a detailed circuit diagram with op-amp pinout. RI is depicted as set for runs with concentrations <1 M. Runs with a concentration of 1 M had an RI value of 100 k.

Exemplary Circuit Including Detailed Information on Components:

FIG. 11 depicts a non-limiting, exemplary circuit according to the present disclosure. The following components were used: R1=33 kΩ resistor (for concentrations <1 M), 100 kΩ resistor (1 M or greater runs); R2=33 kΩ resistor; R3=10 kΩ resistor; R4=23Ω resistor. The op-amp was a OPA551PA (Texas Instruments, Austin, Texas).

All voltages described herein were plotted centered on 0 V for clarity. Due to a small asymmetry in the power supply, at pin 2 there is a −0.04 V DC offset and at pin 6 there is a −0.1 V DC offset. The magnitudes of the voltages plotted are corrected for the offset to reflect the true voltage magnitude spanned. It was verified that this did not impact the measured frequency.

Materials And Methods

Electrolyte Preparation. Potassium perchlorate (99%, Sigma-Aldrich, St. Louis, Missouri), sodium perchlorate (98-102% Alfa Aesar, Waltham, Massachusetts), sodium chloride (99.85%, Fisher Scientific, Waltham, Massachusetts), tetraethylammonium chloride (99%, Thermo Scientific, Waltham, Massachusetts), tetra-n-propylammonium chloride (99%+, Thermo Scientific), and tetrabutylammonium chloride (98%, AstaTech, Mölndal, Sweden) were used as-is to prepare electrolytes with water supplied from a Milli-A Integral Water Purification System (EMD Millipore, Burlington, Massachusetts).

Electrode Material Preparation. Cu (99.9%, 0.5 mm; CBC Metal Supply Corp, Charlotte, North Carolina), 0.5 mm diameter Pt (99.99%, Kurt J. Lesker Co., Clairton, PA 0.5 mm diameter), and Ti wires (99.99%, Fisher Scientific, 1.0 mm diameter) were immobilized in a 1 mL polypropylene syringe with epoxy and allowed to set overnight. The immobilized wires were polished with a successive series of sandpaper (1200 then 2500 grit), 1 μm alumina, and 0.3-μm alumina. Between polishings, the electrodes were sonicated in Milli-Q water for 5 min. PTFE plumbing tape was stretched over the exposed epoxy to provide an inert barrier during electro-chemical experiments. Electrodes were rinsed with Milli-Q water and patted dry prior to use in experiments. Electrodes were stored in centrifuge tubes under atmospheric conditions between experiments.

For the concentration, cation, and anion studies, a BASi standard working platinum electrode (Pt) –1.6 mm diameter, 99.95% purity was used (BASi Research Products, West Lafayette, Indiana). The electrode was rinsed with Milli-Q water prior to use and stored under atmospheric conditions in the manufacturer container with the provided end-cap attached. The electrode surface was polished with 0.3-μm alumina suspension and sonicated for 5 min in Milli-Q water prior to its use in experimentation.

Circuit Function. The circuit functions by using an operational amplifier (op-amp) to compare input voltages at its inverting (labeled "−") and noninverting (labeled "+") input. The noninverting input is set to a reference voltage dictated by the type of op-amp and the values of resistors R1 (33 kΩ) and R2 (33 kΩ). The inverting input is connected to a feedback resistor R3 (10 kΩ) and a capacitor. When the circuit is powered, the capacitor will begin charging toward the positive output saturation voltage. However, when the voltage at the inverting input reaches the reference voltage at the non-inverting input, the sign of the output voltage is reversed. This causes the capacitor to begin discharging toward the negative saturation voltage. The change in sign of the output voltage also changes the sign of the reference voltage, thus the output voltage will reverse again once the inverting input voltage reaches the noninverting input voltage. The circuit does not moderate the gain of the op-amp, which is therefore operating in a saturated state. This causes the output voltage at the op-amp to have a square waveform, which is alternating between the maximum and minimum supply voltage of the op-amp.

Frequency Collection. A Keithley 2230-30-1 triple channel DC power supply was used to power the op-amp of the circuit and provide DC power to the electrochemical cell (Keithley Instruments, Solon, Ohio). Channels 1 and 2 were linked together to create a bipolar power supply for the op-amp, while channel 3 was connected to the working electrode in the cell. A BASi Ag/AgCl reference electrode was used as the counter electrode, and this was connected to the inverting input of the op-amp. The capacitance of the reference electrode was independent of frequency over the ranges employed, indicating it behaved purely as a resistor. Capacitance was thus dominated by the capacitance at the working interface. A Tektronix TBS 1052B-EDU oscilloscope collected the output frequency data and plotted waveforms. The oscilloscope and power supply were controlled via a LabView program (National Instruments Corp., Austin, Texas) which changed the applied potential to the cell and recorded frequency vs time and potential. Each potential was held for 120 s. Anodic sweeps starting at 0 V were conducted first and swept until 1.1 V (concentration studies) or 0.9 V (cation and anion studies) vs Ag/AgCl in 0.1 V increments. The system was returned to 0 V and reconditioned before the cathodic sweeps were started. Anodic and cathodic sweeps were performed separately due to the need to manually switch the cables on the power supply to provide a negative voltage. Potential ranges for the sweeps were determined by the limits of applied voltage at which the system stopped oscillating.

Solution Resistance Compensation. For the dilute concentration studies, to prevent any convolution of frequency increase with increased solution resistance, an external decade box resistor was placed between the reference electrode and its connection to the circuit. The total resistance of the decade box and solution resistance was set to 5.2 kΩ for all runs. A hybrid electrochemical impedance spectroscopy ("EIS") measurement was performed before each anodic and cathodic sweep to measure the series resistance and adjust the decade box accordingly. The materials study did not require this adjustment as the electrolyte concentration was constant across all materials. For the 1 M studies, all solution resistances measured with EIS were less than 200Ω, which was less than 2% of the 10 kΩ resistance of R3 and thus deemed to be negligible.

Electrode Conditioning. Prior to any frequency collection, electrodes were conditioned using a Gamry Reference 600 Potentiostat (Gamry Instruments, Warminster, Pennsylvania) in a 3-electrode setup, the counter electrode was a 0.5 mm diameter Pt wire submerged at least 2 cm into solution. The reference electrode was a 3 M KC! Ag/AgCl electrode from BASi. The conditioning procedures were as follows for the various materials:

Platinum used a cyclic voltammogram (CV) from −0.216 V to 1.1 V vs E,ref with the initial Vat 0.1 V vs $E_{ref}$, and the final V at 0.1 V vs $E_{ref}$ with a scan rate of 100 mV/s for 10 cycles. Titanium used chronoamperometry (CA) for 240 s at −1.5 V vs $E_{ref}$, and copper used CA for 180 s at −1.2 V vs $E_{ref}$.

Electrodes were conditioned in the experimental solution for the concentration and electrode materials studies. For sweeps conducted at 1 M concentrations, the electrodes were conditioned in 7 mM $KClO_4$ to prevent any surface roughening from the concentrated salts prior to frequency collection. The electrodes were rinsed in Milli-Q water and dried prior to being used in the experimental setup. Electrodes were reconditioned between anodic and cathodic sweeps. Conditioning procedures were developed to sufficiently clean the electrode surface such that the frequency at 0 V was not dependent on whether the prior sweep was cathodic or anodic.

Data Processing. The LabView program output an Excel spreadsheet denoting the time spent at each potential, the measured frequency, and the applied potential. A MATLAB code (The Mathworks, Inc., Natick, Massachusetts) was used to convert the individual time spent at each potential into total experimental time. Average frequencies per potential were determined by averaging the frequencies during the last 60 s of the potential hold, which allowed for 60 s of system stabilization.

Figure 12:
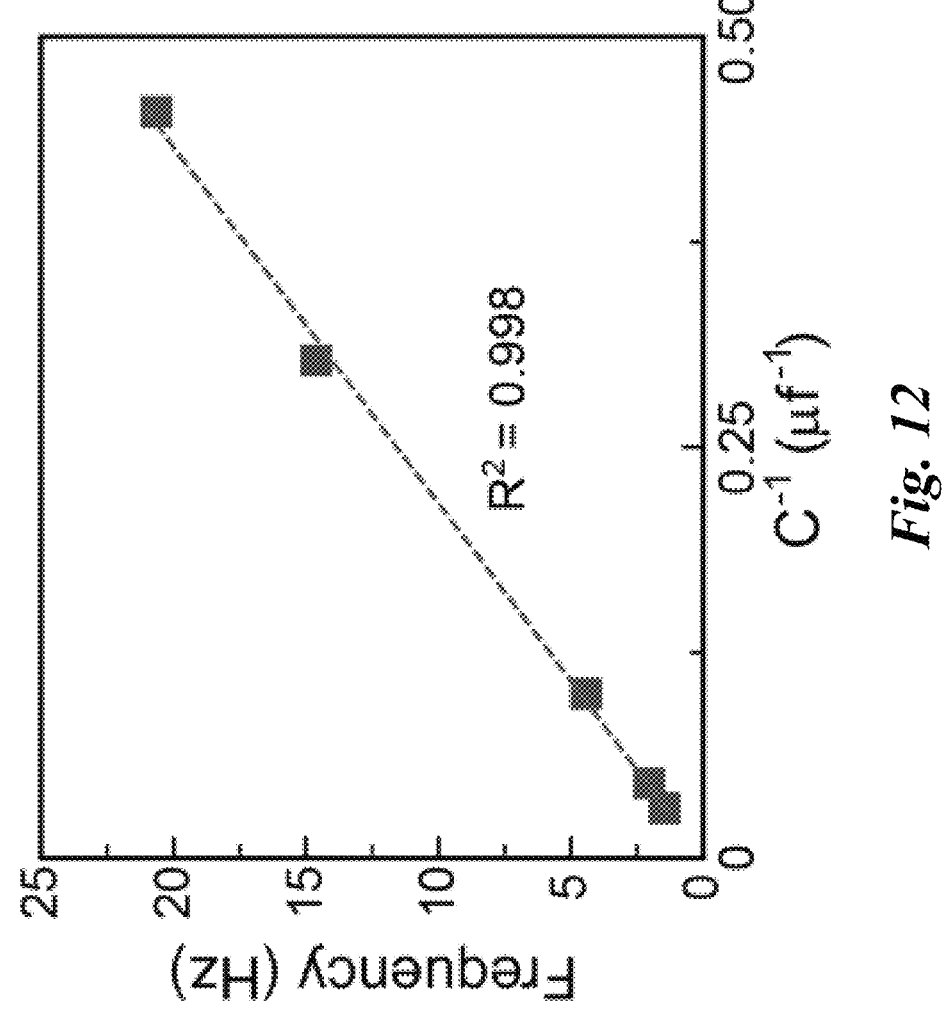
FIG. 12 is a graph showing linear fit of frequency versus inverse capacitance (i.e., elastance), as 1s is consistent with expected circuit behavior.

Relationship Between Capacitance and Frequency:

As noted above in Equations 1 and 2 (see above), the output frequency of a relaxation oscillator circuit is linearly proportional to the inverse of the capacitance. In these equations, f is the output frequency of the circuit, R3 is the resistance of the feedback resistor R3, C is the capacitance of the circuit capacitor, and B is the ratio of resistances between R1 and R2 as described in Eq. 2. This relationship has been verified experimentally using capacitors. See FIG. 12. If additional elements of the electrochemical interface such as series and charge transfer resistances become relevant in magnitude, numerical simulation is required to devise oscillation frequencies.

Figure 13:
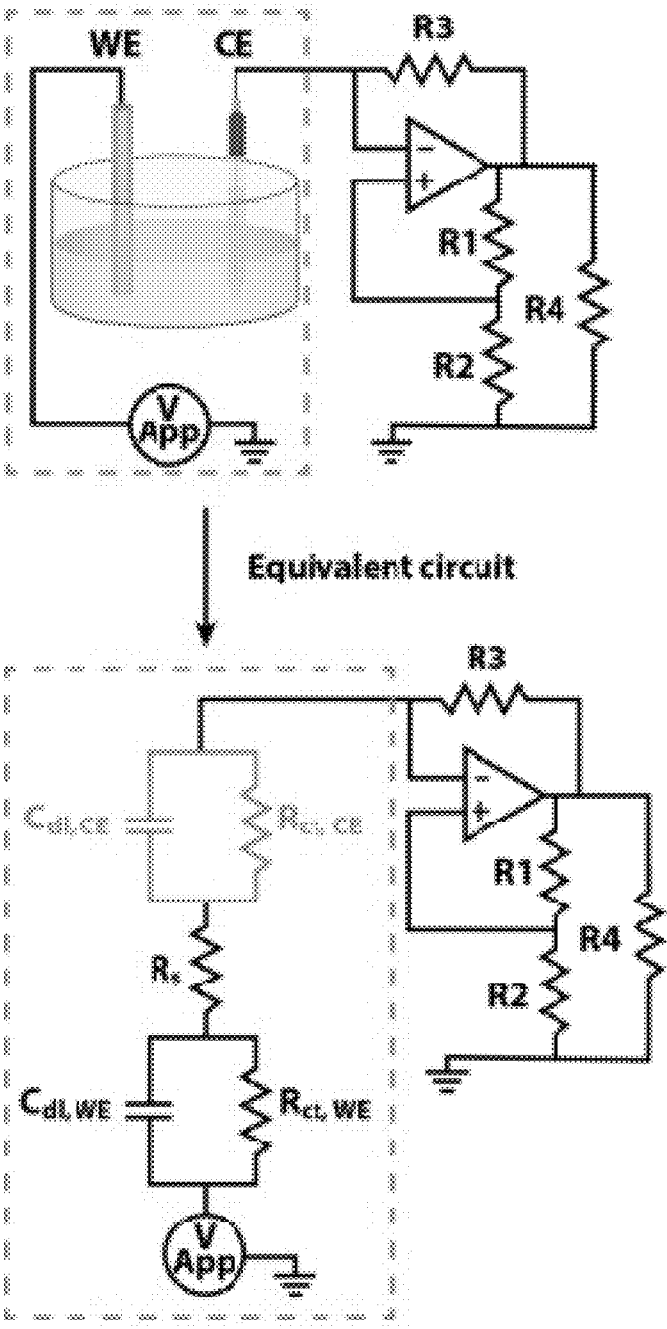
FIG. 13 is a circuit diagram with an equivalent circuit for a two-electrode electrochemical cell depicted with two simplified Randles circuits in series. $C_{ct,CE}$=double layer capacitance for the counter electrode. $R_{ct,CE}$=charge transfer resistance for the counter electrode. $R_S$=series resistance. $C_{ct,WE}$=double layer capacitance of the working electrode. $R_{ct,WE}$=charge transfer resistance of the working electrode.

Equivalent Circuit of the Electrochemical Cell:

As shown below in FIG. 13, the equivalent circuit for the two-electrode electrochemical cell is modeled as two Randles circuits in series connected through the series resistance. Utilizing an Ag/AgCl (3 M KCl) reference electrode as the counter electrode enabled probing of the working electrode interface in isolation as a good reference electrode acts as an ideal resistor over a wide frequency range. This was verified using electrochemical impedance spectroscopy, which showed that the phase angle of the reference electrode is near-zero at all frequencies relevant to the system (data not shown).

The Oscillation Cycle:

A relaxation oscillator circuit generates a square wave voltage output with a specific frequency based on the time constant obtained by continuously charging and discharging a capacitor through a feedback resistor. The circuit generates a square wave output because the operational amplifier (triangle symbol in FIG. 13) is operating at saturation, meaning it switches between outputting its maximum positive and negative supply voltages. In the circuit disclosed herein, the capacitor is replaced by a two-electrode electrochemical cell (FIG. 11), dominated by the electrochemical interface of the working electrode, where the electrochemical double layer recruits and releases charge as the electrostatic potential difference varies with a set amplitude defined by $V_{ref}$. The induced oscillation of the electrostatic potential causes charges to be recruited to and released from the interface in a cyclic manner, with the frequency of the cycle depending upon the properties of the EDL. Illustrated in FIGS. 14A, 14B, and 14C, and FIGS. 15A, 15B, and 15C is an oscillation cycle for Vapp=0, with the assumption that the intrinsic difference in electrostatic potential between the electrode and electrolyte is positive.

Figures 14A, 14B, 14C:
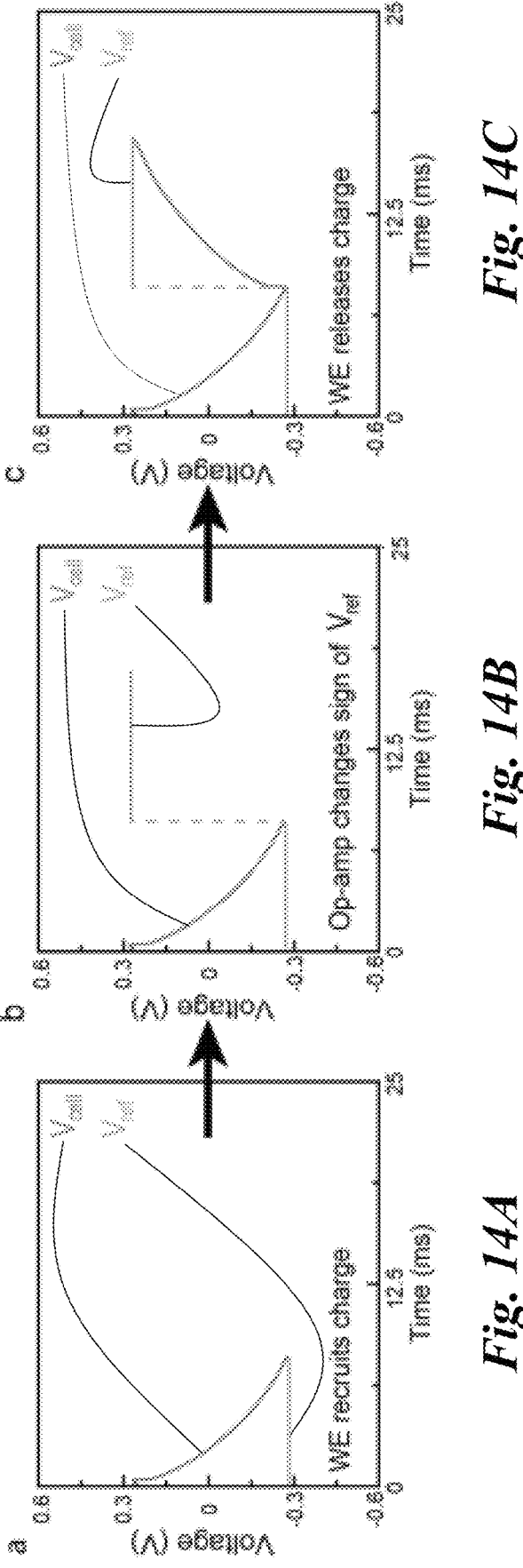
FIGS. 14A, 14B, and 14C are a visual depiction of charge recruit-release cycle showing the initial state (FIG. 14A), the change in sign of the op-amp output (FIG. 14B), and the resulting release of negative charges from the electrochemical double layer, leading to an increase of $V_{cell}$ (FIG. 14C).

Assume that the depicted cycle begins with $V_{cell}=-V_{ref}$ (FIG. 14A). Upon reaching this condition, the op-amp flips to a positive output (FIG. 14B). When the op-amp output is positive, the solution potential increases, attracting negative charges away from the working electrode. This leads to an increase in $V_{cell}$ as the working electrode releases negative charge from the interface (FIG. 14C).

Figures 15A, 15B, 15C:
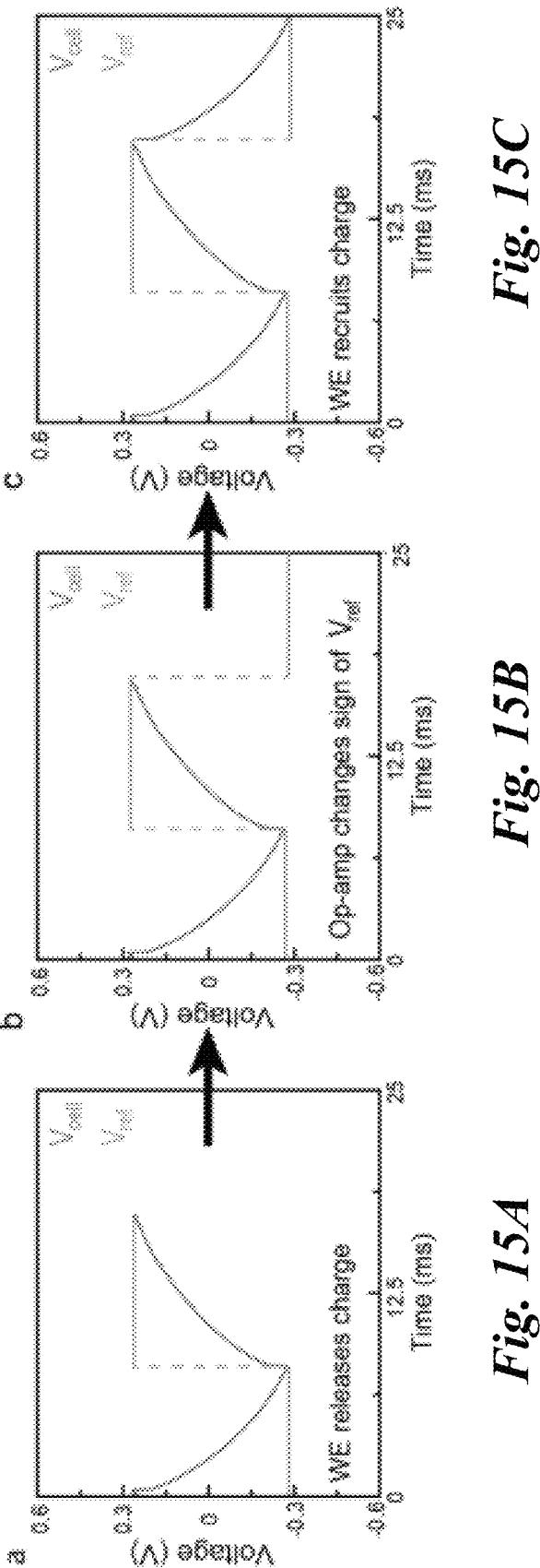
FIGS. 15A, 15B, and 15C are a visual depiction of the charge-recruiting phase of the cycle, which starts when $V_{cell}=+V_{ref}$ (FIG. 15A) causing the change in sign of the op-amp output (FIG. 15B), and the resulting recruitment of negative charges towards the electrochemical double layer, leading to a decrease of $V_{cell}$ (FIG. 15C).
Figure 16:
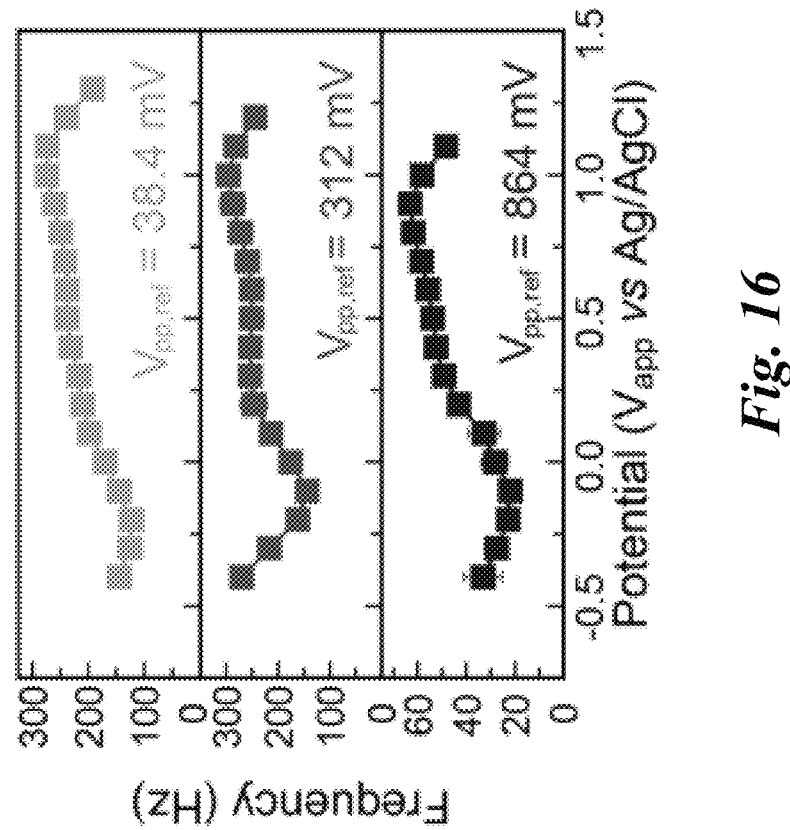
FIG. 16 is a graph depicting oscillation frequency for a 1.6 mm OD Pt electrode in 50 mM $KClO_4$ with peak-to-peak oscillation amplitudes of 38.4 mV (top panel), 312 mV (middle panel), and 864 mV (bottom panel). Frequency trends were preserved across different amplitudes.

Once the voltage across the electrochemical cell equals the positive reference voltage (FIG. 15A), the operational amplifier once again changes the sign of the output voltage, now becoming negative (FIG. 15B). When the op-amp output is negative, the solution potential decreases, driving negative charges towards the working electrode. This leads to a decrease in $V_{cell}$ as the working electrode accumulates negative charge at the interface (FIG. 15C).

The charge recruitment and release cycle continuously repeats with the output frequency of the cycle dictated by the time it takes for the interfacial rearrangement of ions and solvent molecules to compensate for the perturbation of interfacial electrostatic potential by the circuit.

The same principle applies in the presence of an applied potential. However, in the experiments disclosed herein, a voltage was first applied across the electrochemical cell with a DC power supply to generate a difference in electrostatic potential between the electrode and electrolyte ($V_{app}$). This leads to the rearrangement of electrolyte components and the modification of the electrochemical double layer, which changes the time constant of its rearrangement under oscillation and therefore the frequency output of the circuit. The voltage then oscillates between $V_{app}+V_{ref}$ and $V_{app}-V_{ref}$ as described above.

Impact of Oscillation Amplitude on Frequency Trends:

In the concentration study, the peak-to-peak magnitude of the oscillating reference voltage ($V_{app,ref}$) was 864 mV. To verify whether this amplitude impacts the measured frequency trends, the experiments were repeated on a Pt electrode with a 50 mM $KClO_4$ electrolyte using a peak-to-peak $V_{app,ref}$ magnitude of 38.4 mV and 312 mV. As shown in Fig. S16, the potential-dependent trends in frequency were preserved across all oscillation magnitudes. While the observed frequency trends were largely independent of $V_{app,ref}$, the frequency values increased at lower oscillation magnitudes. This behavior is expected because smaller potential oscillations cause less charge to be recruited and released from the interface.

To conduct these experiments probing the effect of $V_{app,ref}$, different combinations of R1, R2, and R3 were used. See Table 1. To reduce $V_{app,ref}$, the ratio of R1 to R2 was increased by switching R2 from 33 kΩ to 10 kΩ then adjusting R1 as needed. Additionally, R3 was increased to 75 kΩ for the 38.4 mV case to bring the frequency into the audible range. This change in R3 did not impact the frequency trends but contributes to the discrepancy in frequency value measured between the different conditions.

| Resistor values for the various $V_{app,\ ref}$ cases | | | |
|---|---|---|---|
| Vapp, ref (mV) | R1 (kΩ) | R2 (kΩ) | R3 (kΩ) |
| 864 | 33 | 33 | 10 |
| 312 | 47 | 10 | 10 |
| 38.4 | 470 | 10 | 75 |

Impact of Anion Adsorption on Audible Signal:

In addition to displacing water from the electrochemical interface, electrolyte ions can specifically adsorb onto the electrode surface, causing changes in the EDL structure by blocking adsorption sites on the electrode. In electrocatalysis, it is known that the adsorption of chloride ions on a Pt electrode will inhibit the formation of platinum oxide and thus suppress the oxygen reduction reaction.

Figure 17:
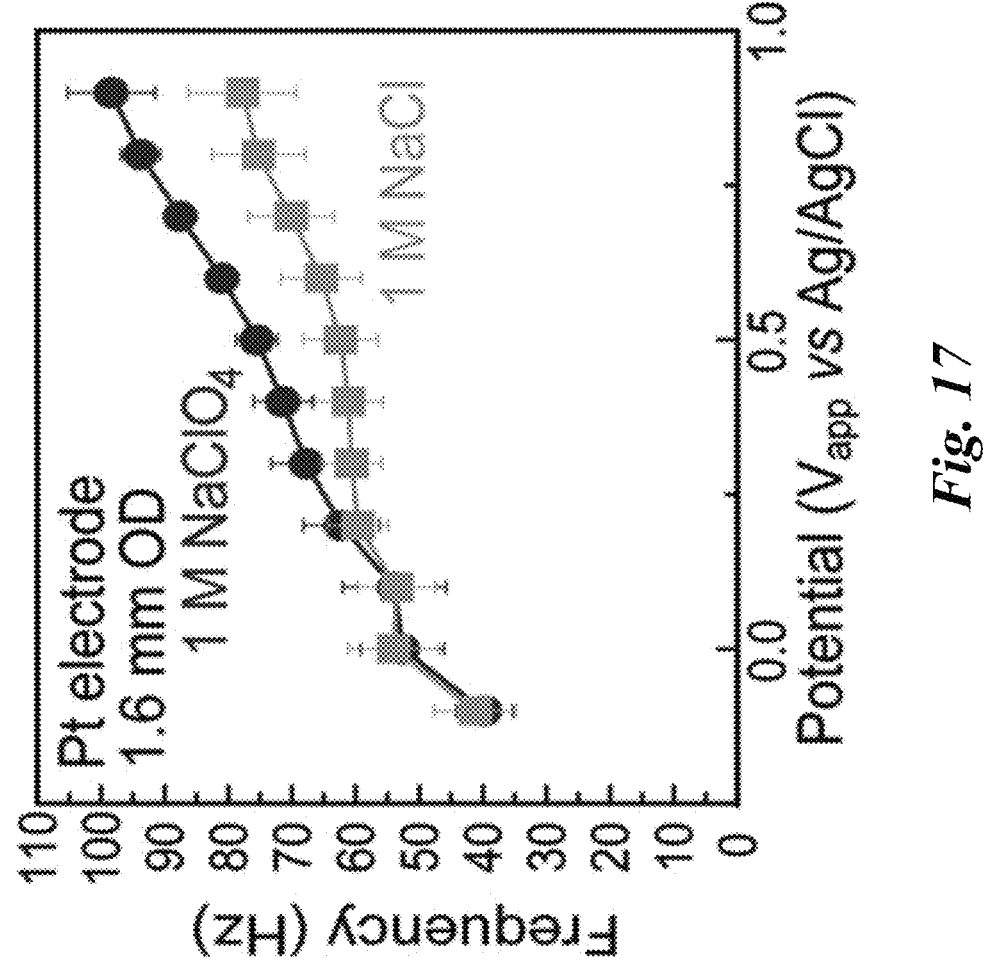
FIG. 17 is a graph depicting frequency vs applied potential data for 1 M solutions of $NaClO_4$ and NaCl electrolyte on a Pt electrode. Error bars represent one standard deviation above and below the mean computed from three trials.

Having observed that forming platinum oxide caused an increase in audible pitch of the interface, it was hypothesized that introducing chloride ions would cause a decrease in audible frequency due to a suppression of surface oxide formation relative to $ClO_4$-anions, which do not adsorb onto the electrode surface. Adding 2 mL of 1 M NaCl into 10 ml of 1 M $NaClO_4$ at 0.6 V vs Ag/AgCl resulted in an instantaneous decrease in pitch, potentially reflecting chloride adsorption that minimizes the formation of surface oxide compounds. Additionally, a distinct voltage-dependent change in pitch could be heard due to the presence of Cl—. Relative to $ClO_4$—, $Cl^-$ ions led to a decrease in pitch at the positive end of the tested potential range. However, the $Cl^-$ ions had minimal impact at potentials negative of 0.3 V, a potential which was within the range of previously reported potentials of zero charge (PZCs) on polycrystalline Pt. See FIG. 17. The absence of changes at potentials negative of the apparent PZC was expected, as the interface should be dominated by water and electrolyte cations, in this case $Na^+$, whose identity and concentration remained unchanged. The ability to hear chloride adsorption, both instantaneously and in trends across voltages creates an opportunity to use sound to probe interactions between anions and the electrode surface.

Conclusion

Disclosed herein is novel method to characterize EDLs using sound. Connecting an electrochemical cell to an astable multivibrator circuit allows for changes in the EDL structure to be tangibly observed in real time through changes in the oscillation frequency. Furthermore, varying the electrolyte concentration, cation, and anion identities allows us to tangibly explain the behavior of double layers in ways that have not thus fare been possible. This provides support for the accuracy and viability of this system as an analytical technique for future electrochemical studies. Future work will include transient studies to look at instantaneous changes in system behavior and thereby observe the rearrangement of the double-layer in real time. Our setup is a unique and simple way to gain unprecedented insight into atomic-level movements through hearing ionic rearrangements.

In short, as disclosed herein, the characteristics of electrochemical interfaces can be transformed into sounds by bringing an EDL into oscillation. Using an electrochemical cell as the tunable element in a relaxation oscillator circuit allows for changes in the EDL structure to be transformed into audible signals. Varying the applied potential, the electrolyte concentration, cation identity, anion identity and the electrode material strongly influenced the sound produced. Additionally, interfacial rearrangements due to cation competition and anion adsorption were heard in real-time, enabling an intuitive manner to study dynamic EDL rearrangements. The auditory signal generated by oscillating electrochemical interfaces provides an unconventional and novel avenue to interpret the abstract molecular phenomena characterizing interface behavior.

Understanding the molecular dynamics of electrified interfaces is essential for innovations in energy storage and sustainable chemical synthesis. Insight revealed by the present method shed light on underappreciated interactions characterizing interface function. These interface functions are critical to researchers active in these areas of electrocatalysis.

REFERENCES (1) Li, H.; Zhang, W.; Yang, X.; Jiang, H.; Wang, Y.; Yang, T.; Chen, L.; Shen, H. State of Charge Estimation for Lithium-Ion Battery Using an Electrochemical Model Based on Electrical Double Layer Effect. *Electrochim Acta* 2019, 326, 134966. https://doi.org/10.1016/j.electacta.2019.134966.

(2) Ringe, S.; Morales-Guio, C. G.; Chen, L. D.; Fields, M.; Jaramillo, T. F.; Hahn, C.; Chan, K. Double Layer Charging Driven Carbon Dioxide Adsorption Limits the Rate of Electrochemical Carbon Dioxide Reduction on Gold. *Nat Commun* 2020, 11 (1), 33. https://doi.org/10.1038/s41467-019-13777-z.

(3) Zheng, Y.; Jiao, Y.; Jaroniec, M.; Qiao, S. Z. Advancing the Electrochemistry of the Hydrogen-Evolution Reaction through Combining Experiment and Theory. *Angewandte Chemie International Edition* 2015, 54 (1), 52-65. https://doi.org/10.1002/anie.201407031.

(4) Bard, A. J.; Faulkner, L. R. *Electrochemical Methods Fundamentals and Applications,* 2nd ed.; John Wiley & Sons: Hoboken, 2001.

(5) Zhang, Z., Bian, L, Tian, H., Liu, Y., Bando, Y., Yamauchi, Y., Wang, Z.-L., Tailoring the Surface and Interface Structures of Copper-Based Catalysts for Electrochemical Reduction of CO2 to Ethylene and Ethanol. Small 2022, 18, 2107450. https://doi.org/10.1002/smll.202107450

(6) Wang, Z., Cao, D., Wen, L. et al. Manipulation of charge transfer and transport in plasmonic-ferroelectric hybrids for photoelectrochemical applications. *Nat Commun* 7, 10348 (2016). https://doi.org/10.1038/ncomms10348

(7) James Marcicki, A. T. Conlisk, Giorgio Rizzoni, A lithium-ion battery model including electrical double layer effects, *Journal of Power Sources* 2014, 251, 157-169.

(8) Simon, P.; Gogotsi, Y.; Dunn, B. Where Do Batteries End and Supercapacitors Begin? *Science* (1979) 2014, 343 (6176), 1210-1211. https://doi.org/10.1126/science.1249625.

(9) Melnick, R. E.; Palmore, G. T. R. Impedance Spectroscopy of the Electro-Oxidation of Methanol on Polished Polycrystalline Platinum. *J Phys Chem B* 2001, 105 (5), 1012-1025. https://doi.org/10.1021/jp0030847.

(10) Hecht, D.; Strehblow, H.-H. XPS Investigations of the Electrochemical Double Layer on Silver in Alkaline Chloride Solutions. *Journal of Electroanalytical Chemistry* 1997, 440 (1-2), 211-217. https://doi.org/10.1016/S0022-0728(97)80058-7.

(11) IBM. Moving Atoms: Making The World's Smallest Movie. Apr. 30, 2013.

(12) IBM. A Boy and His Atom: The World's Smallest Movie. Apr. 30, 2013.

(13) Lust, E. Zero Charge Potentials and Electrical Double Layer at Solid Electrodes. In *Encyclopedia of Interfacial Chemistry*; Elsevier, 2018; pp 316-344. https://doi.org/10.1016/B978-0-12-409547-2.13613-3.

(14) Petrii, O. A. Zero Charge Potentials of Platinum Metals and Electron Work Functions (Review). *Russian Journal of Electrochemistry* 2013, 49 (5), 401-422. https://doi.org/10.1134/S1023193513050145.

(15) Damaskin, B. B.; Petrii, O. A. Historical Development of Theories of the Electrochemical Double Layer. *Journal of Solid State Electrochemistry* 2011, 15 (7-8), 1317-1334. https://doi.org/10.1007/s10008-011-1294-y.

(16) Pajkossy, T. Impedance of Rough Capacitive Electrodes. *Journal of Electroanalytical Chemistry* 1994, 364 (1-2), 111-125. https://doi.org/10.1016/0022-0728(93)02949-1.

(17) Carr, J. P.; Hampson, N. A. Differential Capacitance of the Platinum/Aqueous-Solution Interphase. *Electrochim Acta* 1972, 17 (12), 2117-2128. https://doi.org/10.1016/0013-4686(72)87003-8.

(18) Pajkossy, T.; Kolb, D. M. Anion-Adsorption-Related Frequency-Dependent Double Layer Capacitance of the Platinum-Group Metals in the Double Layer Region. *Electrochim Acta* 2008, 53 (25), 7403-7409. https://doi.org/10.1016/j.electacta.2007.11.068.

(19) Conway, B. E.; Novak, D. M. Chloride Ion Adsorption Effects in the Recombination-Controlled Kinetics of Anodic Chlorine Evolution at Pt Electrodes. *Journal of the Chemical Society, Faraday Transactions 1: Physical Chemistry in Condensed Phases* 1979, 75 (0), 2454. https://doi.org/10.1039/f19797502454.

(20) D. Armstrong, N. A. Hampson, R. J. Latham. The differential capacitance of polycrystalline copper in aqueous solution, Journal of Electroanalytical Chemistry and Interfacial Electrochemistry 1969, 23 (3), 361-367.

(21) N. A. Hampson et. al., J. Electrochem. Soc. 1967, 114 817.

(22) L. Stolberg, J. Richer, J. Lipkowski, D. E. Irish, Adsorption of pyridine at the polycrystalline gold-solution interface, Journal of Electroanalytical Chemistry and Interfacial Electrochemistry 1986, 207 (1-2) 213-214.

(23) T. Hurlen, W. Wilhelmsen. Passive behaviour of titanium, Electrochimica Acta 1986, 31 (9) 1139-1146.

The invention claimed is:

1. A method to generate audio signals from an electrochemical double layer (EDL) comprising operationally connecting an electrochemical cell to an astable multivibrator circuit and outputting a frequency signal generated by potential changes in the electrochemical cell to a speaker or signal recording device.

2. The method of claim 1, wherein the astable multivibrator circuit comprises a working electrode and a counter electrode disposed in the electrochemical cell.

3. The method of claim 2, wherein the working electrode and the counter electrode independently comprise a metal selected from the group consisting of titanium, cobalt, nickel, copper, rhodium, palladium, silver, iridium, platinum, and gold.

4. The method of claim 1, comprising applying a direct current (DC) potential having a voltage to the electrochemical cell.

5. The method of claim 1, wherein the astable multivibrator circuit comprises a direct current power supply operationally connected to a working electrode and a counter electrode; wherein the working electrode and the counter electrode are disposed in an electrochemical cell containing an electrolyte solution; and wherein the counter electrode is operationally connected to means for generating an output frequency corresponding to differences in potential between the working electrode and the counter electrode.

6. A method to generate audio signals from an electrochemical double layer (EDL) comprising operationally connecting an electrochemical cell to an astable multivibrator circuit; applying a direct current (DC) potential having a voltage to the electrochemical cell; and outputting a frequency signal generated by the electrochemical cell to a speaker or signal recording device.

7. The method of claim 6, wherein the astable multivibrator circuit comprises a direct current power supply operationally connected to a working electrode; and a counter electrode; wherein the working electrode and the counter electrode are disposed in an electrochemical cell containing an electrolyte solution; and wherein the counter electrode is operationally connected to means for generating an output frequency corresponding to differences in potential between the working electrode and the counter electrode.

8. The method of claim 6, wherein the electrochemical cell comprises a working electrode and a counter electrode.

9. The method of claim 8, wherein the working electrode and the counter electrode independently comprise a metal selected from the group consisting of titanium, cobalt, nickel, copper, rhodium, palladium, silver, iridium, platinum, and gold.

10. The method of claim 6, further comprising varying the voltage of the applied DC potential to bring the EDL into resonance and outputting the frequency signal generated by the electrochemical cell when the EDL is in resonance.

11. The method of claim 6, further comprising sweeping the voltage of the applied DC potential.

12. The method of claim 6, comprising sweeping the voltage of the applied DC potential from about −2 V to about 2 V.

13. The method of claim 6, comprising sweeping the voltage of the applied DC potential from about −1.5 V to about 1.5 V.

14. The method of claim 6, comprising sweeping the voltage of the applied DC potential from about −1 V to about 1 V.

15. A circuit comprising a direct current power supply operationally connected to a working electrode; and a counter electrode and an electrochemical cell containing an electrolyte solution; wherein the working electrode and the counter electrode are disposed in the electrolyte solution; and wherein the counter electrode is operationally connected to means for generating an output frequency within human audible range corresponding to differences in potential between the working electrode and the counter electrode.

16. The circuit of claim 15, wherein the means for generating an output frequency comprises a relaxation oscillator circuit.

17. The circuit of claim 16, wherein the relaxation oscillator circuit comprises a feedback resistor and an operational amplifier, wherein the feedback resistor is operationally linked to the counter electrode and an inverting input of the operational amplifier; and at least two resistors operationally liked to a non-inverting input of the operational amplifier, wherein the resistors are configured to set a voltage or voltage range so that the output frequency is within human audible range.

* * * * *